(12) United States Patent
Sanchez et al.

(10) Patent No.: US 11,739,220 B2
(45) Date of Patent: Aug. 29, 2023

(54) PERHYDROPOLYSILAZANE COMPOSITIONS AND METHODS FOR FORMING OXIDE FILMS USING SAME

(71) Applicants: L'Air Liquide, Société Anonyme pour l'Etude et l'Exploitation des Procédés Georges Claude, Paris (FR); American Air Liquide, Inc., Fremont, CA (US)

(72) Inventors: Antonio Sanchez, Tsukuba (JP); Gennadiy Itov, Flemington, NJ (US); Manish Khandelwal, Somerset, NJ (US); Cole Ritter, Easton, PA (US); Peng Zhang, Branchburg, NJ (US); Jean-Marc Girard, Versailles (FR); Zhiwen Wan, Plano, TX (US); Glenn Kuchenbeiser, Fremont, CA (US); David Orban, Hampton, NJ (US); Sean Kerrigan, Princeton, NJ (US); Reno Pesaresi, Easton, PA (US); Matthew Damien Stephens, Morristown, NJ (US); Yang Wang, Garnet Valley, PA (US); Guillaume Husson, Newark, DE (US); Grigory Nikiforov, Bridgewater, NJ (US)

(73) Assignees: L'Air Liquide, Société Anonyme pour l'Etude et l'Exploitation des Procédés Georges Claude, Paris (FR); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 16/971,869

(22) PCT Filed: Feb. 21, 2019

(86) PCT No.: PCT/US2019/018985
§ 371 (c)(1),
(2) Date: Aug. 21, 2020

(87) PCT Pub. No.: WO2019/165093
PCT Pub. Date: Aug. 29, 2019

(65) Prior Publication Data
US 2021/0087406 A1   Mar. 25, 2021

Related U.S. Application Data

(60) Provisional application No. 62/633,193, filed on Feb. 21, 2018.

(51) Int. Cl.
*C09D 1/00* (2006.01)
*C09D 7/63* (2018.01)
(Continued)

(52) U.S. Cl.
CPC .............. *C09D 1/00* (2013.01); *B05D 1/005* (2013.01); *B05D 3/0254* (2013.01);
(Continued)

(58) Field of Classification Search
CPC . C09D 1/00; C09D 7/63; B05D 1/005; B05D 3/0254; C01B 21/068;
(Continued)

(56) References Cited

U.S. PATENT DOCUMENTS 3,137,599 A   6/1964 Alsgaard et al.
4,200,666 A   4/1980 Reinberg
(Continued)

FOREIGN PATENT DOCUMENTS

DE   2 231 008   1/1974
EP   0 304 239   2/1989
(Continued)

OTHER PUBLICATIONS

Stock, A. et al., Siliconhydrides X. Nitrogen-containing compounds, Ber, B: Abhandlungen (1921), 54B, 740-758.
(Continued)

Primary Examiner — James A Fiorito
(74) Attorney, Agent, or Firm — Allen E. White; Yan Jiang; Patricia E. McQueeney

(57) ABSTRACT

A Si-containing film forming composition comprising a catalyst and/or a polysilane and a N—H free, C-free, and Si-rich perhydropolysilazane having a molecular weight ranging from approximately 332 dalton to approximately 100,000 dalton and comprising N—H free repeating units having the formula [—N(SiH3)x(SiH2-)y], wherein x=0, 1, or 2 and y=0, 1, or 2 with x+y=2; and x=0, 1 or 2 and y=1, 2, or 3 with x+y=3. Also disclosed are synthesis methods and applications for using the same.

17 Claims, 11 Drawing Sheets

(51) Int. Cl.
| | |
|---|---|
| B05D 1/00 | (2006.01) |
| B05D 3/02 | (2006.01) |
| C01B 21/068 | (2006.01) |
| C01B 21/087 | (2006.01) |
| C01B 33/12 | (2006.01) |
| C23C 18/12 | (2006.01) |

(52) U.S. Cl.
CPC .......... *C01B 21/068* (2013.01); *C01B 21/087* (2013.01); *C01B 33/126* (2013.01); *C09D 7/63* (2018.01); *C23C 18/1204* (2013.01); *C23C 18/1208* (2013.01); *C23C 18/1279* (2013.01)

(58) Field of Classification Search
CPC . C01B 21/087; C01B 33/126; C23C 18/1204; C23C 18/1208; C23C 18/1279
See application file for complete search history.

(56) References Cited

U.S. PATENT DOCUMENTS

| | | |
|---|---|---|
| 4,395,460 A | 7/1983 | Gaul |
| 4,412,874 A | 11/1983 | Huskins et al. |
| 4,482,669 A | 11/1984 | Seyferth et al. |
| 4,746,480 A | 5/1988 | Clark |
| 5,145,812 A | 9/1992 | Arai et al. |
| 5,208,284 A | 5/1993 | Niebylski |
| 5,364,920 A | 11/1994 | Bujalski et al. |
| 5,905,130 A | 5/1999 | Nakahara et al. |
| 6,329,487 B1 | 12/2001 | Abel et al. |
| 6,479,405 B2 | 11/2002 | Lee et al. |
| 6,706,646 B1 | 3/2004 | Lee et al. |
| 6,767,641 B1 | 7/2004 | Shimizu et al. |
| 7,015,114 B2 | 3/2006 | Seo |
| 7,053,005 B2 | 5/2006 | Lee et al. |
| 7,270,886 B2 | 9/2007 | Lee et al. |
| 7,429,637 B2 | 9/2008 | Hong et al. |
| 7,994,019 B1 | 8/2011 | Kweskin et al. |
| 8,163,261 B2 | 4/2012 | Hazeltine |
| 8,232,176 B2 | 7/2012 | Lubomirsky et al. |
| 8,563,129 B2 | 10/2013 | Rode et al. |
| 8,969,172 B2 | 3/2015 | Nakamoto et al. |
| 9,082,612 B2 | 7/2015 | Yun et al. |
| 9,096,726 B2 | 8/2015 | Lim et al. |
| 9,165,818 B2 | 10/2015 | Takano et al. |
| 9,382,269 B2 | 7/2016 | Sanchez et al. |
| 9,567,488 B2 | 2/2017 | Fish |
| 2005/0279255 A1 | 12/2005 | Suzuki et al. |
| 2007/0196672 A1 | 8/2007 | Brand et al. |
| 2008/0305611 A1 | 12/2008 | Hirota |
| 2010/0184268 A1 | 7/2010 | Hirota |
| 2012/0103857 A1 | 5/2012 | Behm et al. |
| 2012/0142198 A1 | 6/2012 | Wang et al. |
| 2012/0160801 A1 | 6/2012 | Padmanaban et al. |
| 2012/0214006 A1 | 8/2012 | Chen et al. |
| 2012/0291665 A1 | 11/2012 | Wieber et al. |
| 2013/0017662 A1 | 1/2013 | Park et al. |
| 2013/0164690 A1 | 6/2013 | Shinde et al. |
| 2014/0106576 A1 | 4/2014 | Morita et al. |
| 2014/0113432 A1 | 4/2014 | Ching et al. |
| 2014/0127630 A1 | 5/2014 | Shinde et al. |
| 2014/0341794 A1 | 11/2014 | Hoppe et al. |
| 2015/0004421 A1 | 1/2015 | Fujiwara et al. |
| 2015/0252222 A1 | 9/2015 | Ozaki et al. |
| 2015/0298980 A1 | 10/2015 | Hayashi et al. |
| 2015/0307354 A1 | 10/2015 | Hoppe |
| 2015/0364632 A1 | 12/2015 | Cho et al. |
| 2016/0176718 A1 | 6/2016 | Jang et al. |
| 2016/0308184 A1 | 10/2016 | Joo et al. |
| 2016/0379817 A1* | 12/2016 | Okamura .............. C01B 21/087 |
| | | 438/781 |
| 2017/0044401 A1 | 2/2017 | Yamakawa et al. |
| 2017/0240423 A1 | 8/2017 | Fujiwara et al. |
| 2017/0323783 A1 | 11/2017 | Sanchez et al. |
| 2018/0072571 A1 | 3/2018 | Sanchez et al. |

FOREIGN PATENT DOCUMENTS

| | | |
|---|---|---|
| EP | 3 082 153 | 10/2016 |
| JP | 2016 159561 | 9/2016 |
| KR | 2012 0066389 | 3/2013 |
| KR | 2014 0087903 | 7/2014 |
| KR | 2014 0087908 | 1/2016 |
| WO | WO 2009 087609 | 7/2009 |
| WO | WO 2015 047914 | 4/2015 |
| WO | WO 2016 065219 | 4/2016 |
| WO | WO 2016 160990 | 10/2016 |
| WO | WO 2019 165102 | 8/2019 |

OTHER PUBLICATIONS

Aoki, T. et al., Porous silicon oxynitride films derived from polysilazane as a novel low-dielectric constant material, Mat. Res. Soc. Symp. Proc. vol. 565, 1999, 41-46.
Aylett, B.J. et al., N-silyl derivatives of cyclic secondary amines, J. Chem. Soc. (A), 1967, 1918-1921.
Aylett, B.J. et al., The preparation and properties of dimethylamino- and diethylamino-silane, J. Chem. Soc. (A), 1967, 652-655.
Aylett, B.J. et al., The preparation and some properties of disilylamine, Inorg. Chem., 5(1), 1966, 167.
Aylett, B.J. et al., Silicon-nitrogen compounds. Part VI. The preparation and properties of disilazane, J. Chem. Soc. (A), 1969, 639-642.
Aylett, B.J. et al., Silicon-nitrogen compounds. Part VIII. Base-promoted disproportionation of N-methyl- and N-phenyl-disilazane, J. Chem. Soc. (!), 1969, 1788-1792.
Bae, J.H. et al., Decreasing the curing temperature of spin-on dielectrics by using additives, Advances in Patterning Materials and Processes XXXI, Thomas I Wallow, Christoph K. Hohle, ed., Proc. of SPIE vol. 9051, 90511R-1-90511R-5.
Blum, Y et al., Catalytic methods for the synthesis of oligosilanzanes, Organometallics 1986, 5, 2081-2086.
Burg, A.B. et al., Silyl-amino boron compounds, J. Am. Chem. Soc., 1950, 72(7), 3103-3107.
Furuya, T. et al., Catalysis for fluorination and trifluoromethylation, Nature, May 26, 2011, 473(7348), 470-477.
Glidewell, C., Reactions of silylphosphine with amines and imines, Inorg. Nucl. Chem. Letters, vol. 10, 1974, 39-41.
Günthner, M. et al., Conversion behavior and resulting mechanical properties of polysilazane-based coatings, Journal of the European Ceramic Society, 32 (2012) 1883-1892.
Hauser, R. et al., Processing and magnetic properties of metal-containing SiCN ceramic micro-and nano-composites, J. Mater Sci (2008) 43, 4042-4049.
Hirao, T. et al., Thermal stability of hydrogen in silicon nitride films prepared by ECR plasma CVD method, Japanese Journal of Applied Physics, Vo9l. 27, No. 4, Apr. 1988, 528-533.

(56) References Cited

OTHER PUBLICATIONS

Isoda, T. et al., Perhydropolysilazane precursors to silicon nitride ceramics, Journal of Inorganic and Organometallic Polymers, vol. 2, No. 1, 1992, 151-160.

Longjuan, T. et al., Dependence of wet etch rate on deposition, annealing conditions and etchants for PECVD silicon nitride film, Journal of Semiconductors, vol. 30, No. 9, Sep. 2009, 096005-1 to 096005-4.

MacDiarmid, A.G., Silanes and their derivatives, Advan. Inorg. Chem. Radiochem., 1961, 3, 207-256.

Morlier, A. et al., Thin gas-barrier silica layers from perhydropolysilazane obtained through low temperature curings: A comparative study, Thin Solid Films 524 (2012) 62-66.

Neumann, C.N. et al., C—H fluorination: U can fluorinate unactivated bonds, Nature Chemistry, 2016, 8, 822-823.

Norman, A.D. et al., Reaction of silylphosphine with ammonia, Inorganic Chemistry, vol. 18, No. 6, 1979, 1594-1597.

Scantlin, W.M. et al., The borane-catalyzed condensation of trisilazane and n-methyldisilazane, Inorganic Chemistry, vol. 11, No. 12, 1972, 3082-3084.

Scantlin, W.M. et al., Pentaborane(9)-catalysed condensation of silylamines, Chemical Communications, 1971, 1246.

Schwab, S.T. et al., The pyrolitic conversion of perhydropolysilazane into silicon nitride, Ceramics International 24 (1998) 411-414.

Shinde, N. et al., Spin-On silicon-nitride films for photo-lithography by RT cure of polysilazane, Journal of Photopolymer Science and Technology, vol. 23, No. 2, 2010, 225-230.

Thompson, M.L., Silyl group exchange between chlorosilane and n-methyldisilazane, Inorganic Chemistry, vol. 18, No. 10, 1979, 2939-2940.

University of Louisville Micro/Nano Technology Center, Spin coating theory, Oct. 2013, 4 pages.

Wells, R.L. et al., Studies of silicon-nitrogen compounds. The base-catalyzed elimination of silane from trisilylamine, Journal of the American Chemical Society, 88:1, Jan. 5, 1966, 37-42.

International Search Report and Written Opinion for corresponding PCT/US2019/018985, dated May 6, 2019.

International Search Report and Written Opinion for related PCT/US2019/019000, dated May 3, 2019.

International Search Report and Written Opinion for related PCT/US20178/065581, dated Mar. 6, 2018.

* cited by examiner

PERHYDROPOLYSILAZANE COMPOSITIONS AND METHODS FOR FORMING OXIDE FILMS USING SAME

CROSS REFERENCE TO RELATED APPLICATIONS

This application is a 371 of International Application No. PCT/US2019/018985, filed Feb. 21, 2019, which claims priority to US Provisional Patent Application No. 82/633,193, filed Feb. 21, 2018, the entire contents of which are incorporated herein by reference.

TECHNICAL FIELD

A Si-containing film forming composition comprising a catalyst and/or a polysilane and a N—H free, C-free, and Si-rich perhydropolysilazane having a molecular weight ranging from approximately 332 dalton to approximately 100,000 dalton and comprising N—H free repeating units having the formula $[-N(SiH_3)_x(SiH_2-)_y]$, wherein x=0, 1, or 2 and y=0, 1, or 2 with x+y=2; and x=0, 1 or 2 and y=1, 2, or 3 with x+y=3. Also disclosed are synthesis methods and applications for using the same.

BACKGROUND

Much literature has been generated regarding conversion of perhydropolysilazanes (PHPS) into silicon oxide and silicon nitride films.

Typical synthesis of PHPS involves ammonolysis of silanes to form chains containing the $H_3Si$—N(-)-$SiH_3$ units. The ammonolysis method involves the reaction of $NH_3$ with a halosilane, preferably a dihalosilane, as follows:

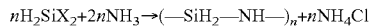

$$nH_2SiX_2 + 2nNH_3 \rightarrow (-SiH_2-NH-)_n + nNH_4Cl$$

Various families of catalysts, including amines, boranes, and organometallics, have also been used to synthesize PHPS polymers from molecular precursors and affect the cross linking. See, e.g., 1) Scantlin et al. Chemical Communications, 1971, p. 1246; 2) US 2016/0379817 to Okamura; 3) U.S. Pat. No. 4,748,480 A to Clark; 4) U.S. Pat. No. 5,905,130A to Nakahara.

Shrinkage of the oxide or nitride films generated from PHPS is normally detrimental for semiconductor applications since it results in stress in the resulting cured film. See, e.g., Bae et al., Decreasing the Curing Temperature of Spin-On Dielectrics by Using Additives, Advances in Patterning Materials and Processes XXXI, Proc. Of SPIE Vol. 9051 (2014). This stress may lead to voids, pinholes, and cracks. Id.

Gunthner et al. report that the mass change (i.e., weight loss) of a 20% solution of PHPS in dibutyl ether occurs at pyrolysis temperatures up to 700° C. Journal of the European Ceramic Society, 32 (2012) pp. 1883-1889, at p 1885, The PHPS was synthesized by ammonolysis of $SiH_2Cl_2$. Id. at 1884. Film shrinkage continued until temperatures of 1000° C. under Na and air (FIG. 6). Id. at 1888. The to resulting film shrank approximately 55% in air and approximately 70% in $N_2$. Id. Gunthner et al, attribute the reduced shrinkage in air to incorporation of oxygen. Id. at 1887.

Schwab et al. disclose that a PHPS formed by ammonolysis of dichlorosilane and trichlorosilane loses 20% mass and has a density that increases by a factor approximately 2.3 when pyrolysed under dry $N_2$ at a temperature of 750° C. Ceramics International 24(1998) pp. 411-414, at 412.

Shinde et al. reported that spin-on PHPS could be an Interesting alternative to conventional CVD processes. However, the $(-SiH_2-NH-)_x$ based PHPS spin-on polymer shrinks 25% under VUV exposure, and 35% when the films are less than nm thick. Moreover, their SIMS analysis showed that the PHPS films was not fully converted to SiN films, because there was still a large amount of H atoms after UV curing. It is reasonable to expect an even higher shrinkage after removing these H atoms. Journal of Photopolymer Science and Technology, Vol. 23, No. 2 (2010) pp. 225-230.

US Pat. App. Pub. No. 2013/0017662 to Park et al. discloses a filler for filling a gap including a compound having the formula $Si_aN_bO_cH_d$, wherein 1,96<a<2.68, 1,78<b<3.21, 0≤c<0.19, and 4<d<10. Abstract. The filler is synthesized by reacting a hydrogenated polysilazane or hydrogenated polysiloxane with trisilylamine in pyridine. Id. at paras 0064-0065. The application targets a compound having a N:Si mole ratio between about 0.7 to about 0.95 to reduce film shrinkage. Id. at para 0051.

US Pat. App. Pub. No. 2016/0379817 to Okamura et al. disclose a specific perhydropolysilazane that forms siliceous films with minimal defects, and a curing composition comprising the perhydropolysilazane. To do so, Okamura et al. subject PHPS to further processing in order to produce the specified perhydropolysilazane. See, e.g., Examples 1-4.

Shinde et al, 2010, journal of Photopolymer Science and Technology, Vol. 23, P. 225 reported that spin-on PHPS could be an interesting alternative to conventional CVD processes. However, the spin-on PHPS film shrinkage was still 25-35% after curing with UV irradiation at room temperature. Moreover, their SIMS analysis showed that the PHPS films was not fully converted to SiN films, because there was still a large amount of H atoms after UV curing. It is reasonable to expect to even higher shrinkage after removing these H atoms.

Several families of additives, including catalysts, have been used in literature to blend with existing PHPS formulations to form coating formulations. The catalysts may reduce PHPS oxidation temperature, ideally to room temperature, when converting it to silicon oxide for applications in gas-barrier films, self-cleaning coatings, anti-reflection coatings, ceramic fibers. See, e.g., 1) JP2016159561 to Mitsubishi; 2) Morlier et al. Thin Solid Films 524:82-86; 3) US 20070196672A1 to Brand; 4) U.S. Pat. No. 8,563,129 B2 to Rode; 5) US20160308184 A1 to Joo.

Clariant claimed a coating solution comprising a polysilazane having a Si—H bond, a diluting solvent and a catalyst which is selected from the group consisting of a N-heterocyclic compound, an organic acid, an inorganic acid, a metal carboxylate, an acetylacetonate complex, fine metal particles, a peroxide, a metal chloride, an organometallic compound, and mixtures thereof. US Pat. App. No. 2005/0279255A. The polysilazane includes N—H groups. Id. at para 0026.

Dow Corning Corp described a method for crosslinking polysilazane polymers having Si—H or N—H bonds by mixing the polysilazane with silazane crosslinker having at least 2 boron functional groups which can react with the Si—H or N—H bonds. U.S. Pat. No. 5,364,920. While the stiffness of the obtained material after curing at elevated temperature is said to increase, indicating a better cross linking of the polymer, no indication is given about mass loss or shrinkage during the curing. Additionally, the addition of the catalyst to the formulation leads to gas evolution, which can be explained by the release of volatile silanes. While this effect is not a problem during the preparation of the polymer, it is expected to be detrimental during the curing step when the primary target is to limit the film shrinkage.

Aoki et al. Mat. Res. Soc. Symp. Proc. 1999, p. 41 reported using Aluminum ethylacetoacetate as a catalyst for promoting the oxidation of PHPS under ambient atmosphere to low-k HSiON film. It was assumed that the Al catalyst could selectively catalyze the oxidation of the N—H bond in the PHPS and then form Si—OH groups and $NH_3$. The Si—OH groups would then condense to form Si—O—Si bridges. However, no shrinkage data were reported. The fact that the film has a low dielectric constant is also an indication of the low film density, and/or the remain of to large quantities on Si—H bonds and N—H in the film. Such films are typically etched very rapidly in dilute HF solution and are not suitable for gapfill spin on applications like shallow trench isolation or pre-metal dielectrics in advanced semiconductor device, where high quality silicon oxide having a wet etch rate as close as possible to a thermal oxide (i.e. $SiO2$ formed by the thermal oxidation of Si under $O2/H2O$ vapor at elevated temperature, typically >800° C.) film are sought.

Bae et al. Proc. of SPIE, 2014, p. 90511 reported using proprietary amines as an additive for promoting the oxidation of PHPS at low temperature (400-600° C.) to silicon oxide films. However, it is expected that the amines will interact and react with the PHPS during the curing process and chemically bind to the polymer, yielding C contaminated films. For semiconductor applications, the absence of C contamination is strongly desired (typically <5 at. %, and more preferably <1 at. %).

US Pat App Pub No 2010/0184268 A1 claims a method for producing a semiconductor device comprising: coating the coating composition for forming an oxide film comprising: a polysilazane and a polysilane on a substrate and forming the oxide film inside the groove by heat treatment in an oxidizing atmosphere. The formulas of polysilazane $(SiH_2NH)_n$ (n—positive integer) and polysilane $Si_nR_{2n+2}$ and $Si_nR_{2n}$ (n≥3, R—hydrogen) are mentioned only in embodiment.

A silicon-based coating composition, comprising: of a) polysilazane $[H_2Si—NH]_n$, b) polysiloxane, c) polysilane of a formula $(R^1R^2Si)_n$, wherein n is greater than 1, $R^1$, $R^2$-organic group and d) organic solvent is claimed in U.S. Pat. No. 9,567,488 B2. The cured coatings have a thickness between 0.1 μm and 3 μm, and having hardness between about 4H and about 9H for superior mold release characteristics.

A need remains to develop new compositions, formulations, and methods to further reduce PHPS film shrinkage, and equally important, to establish the understanding between additive chemistry and shrinkage.

Notation and Nomenclature

Certain abbreviations, symbols, and terms are used throughout the following description and claims, and include:

As used herein, the indefinite article "a" or "an" means one or more.

As used herein, the terms "approximately" or "about" mean ±10% of the value stated.

As used herein, the term "comprising" is inclusive or open-ended and does not exclude additional, unrecited materials or method steps; the term "consisting essentially of" limits the scope of a claim to the specified materials or steps and additional materials or steps that do not materially affect the basic and novel characteristics of the claimed invention; and the term "consisting of" excludes any additional materials or method steps not specified in the claim.

As used herein, "Si-rich" PHPS means a PHPS having a Si:N ratio ranging from between 2.5:1 and 1.5:1. The Si:N ratio may normally be estimated by measuring the refractive index of the PHPS product and is calculated using the formula $[N]/[Si]=[4(n_{a\text{-}Si:H}-n)]/[3(n+n_{a\text{-}Si:H}-2n_{a\text{-}Si3N4})]=4(3.3-n)/3(n-0.5)$, wherein $n_{a\text{-}Si:H}=3.3$ and $N_{a\text{-}Si3N4}=1.9$ are the refractive indices of a-Si:H and nearly stoichiometric $a\text{-}Si_3N_4$. See, e.g., Section 3.1 of Longjuan et al., Journal of Semiconductors, Vol. 30, No. 9 (September 2009).

As used herein, the abbreviation "RT" means room temperature or a temperature ranging from approximately 18° C. to approximately 25° C.

As used herein, "N—H free" means that less than typically 1% of all of the N atoms in the substance have an N—H bond, and that approximately 99% to approximately 100% of the N atoms are bonded to 3 silicon atoms. One of ordinary skill in the art will recognize that FTIR and/or $^{1H}$NMR may be used to quantitatively determine the molar percentage of N—H bonds present in a sample by measuring peak/height areas for known concentrations and developing a calibration curve therefrom.

As used herein, "C-free" means that the N—H free repeating units have no Si—C bonds or N—C bonds. One of ordinary skill in the art will recognize that FTIR and/or $^{29}$Si-NMR may be used to quantitatively determine the molar percentage of Si—C bonds present in a sample by measuring peak/height areas for known concentrations and developing a calibration curve therefrom.

As used herein, the abbreviation Mn stands for the number averaged molecular weight or the total weight of all of the polymer molecules in a sample divided by the total number of polymer molecules in the sample (i.e., $M_n=\Sigma N_iM_i/\Sigma N_i$, wherein $N_i$ is the number of molecules of weight $M_i$); the abbreviation $M_w$ stands for weight averaged molecular weight or the sum of the weight fraction of each type of molecule multiplied by the total mass of each type of molecule (i.e., $M_w=\Sigma\ [(N_iM_i/\Sigma N_iM_i)*N_iM_i]$; the term "Poly Dispersity Index" or PDI means the ratio of $M_w:M_n$; the term "volatile PHPS" means a molecular complex having a $M_n$ ranging from 107 to 450; the term "oligomer" means a liquid molecular complex having a $M_n$ typically ranging from 450 to 20,000; the term "polymer" means a solid molecular complex having a $M_n$ typically ranging from 10,000 to 2,000,000.

As used herein, "catalyst" means a substance that increases the rate of a reaction without modifying the overall standard Gibbs energy change in the reaction (from IUPAC. Compendium of Chemical Terminology, Version 2.3.3, 2014-02-24); "desilylative coupling (DSC) catalyst" means a catalyst that removes $SiH_4$ to generate a new bond. Typically, catalytic desilylative coupling facilitates the creation of a =N—SiH$_2$—N= cross linking between two =N—SiH$_3$ groups and the release of $SiH_4$. "Dehydrocoupling (DHC) catalysts" means a catalyst that promotes the reaction between Si—H and an H-E groups (E being N, O or Si) to create an Si-E bond, with the release of $H_2$. Some catalyst may promote both reactions, while others are specific to one reaction.

As used herein, a polysilane means a compound or mixture of compounds having at least one Si—Si bond. Per-hydrido polysilanes have at least one Si—Si bond, and all the non-Si atoms linked to silicon atoms are hydrogens. Perhydrido polysilanes have a general formula of $Si_nH_{2n+2}$ for linear or branched compounds, and $Si_nH_{2n+2-2m}$ formula for compound with m cycles. For instance, cyclohexasilane has a formula $Si_6H_{12}$.

As used herein, "critical dimension" means the width of the aspect ratio or the distance from the beginning to the end of the trench/gap/via.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x$ $(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the term "amyl" refers to an amyl or pentyl group (i.e., a C5 alkyl group); the term "tAmyl" refers to a tert-amyl group, also known as 1,1-dimethylpropyl.

As used herein, the abbreviation "Cp" refers to cyclopentadienyl group; the abbreviation "Cp*" refers to a pentamethylcyclopentadienyl group; the abbreviation "TMS" refers to trimethylsilyl ($Me_3Si$—); and the abbreviation "TMSA" refers to bis(trimethylsilyl)amine [—$N(SiM_3)_2$].

As used herein, the abbreviation "$N^{R, R'}$ R"-amd" or $N^R$ R"-amd when R=R' refers to the amidinate ligand [R—N—C(R")=N—R'], wherein R, R' and R" are defined alkyl groups, such as Me, Et, nPr, iPr, nBu, iBi, sBu or tBu; the abbreviation "$N^{R, R'}$-fmd" or $N^R$-fmd when R=R' refers to the formidinate ligand [R—N—C(H)=N—R'], wherein R and R' are defined alkyl groups, such as Me, Et, nPr, iPr, nBu, iBi, sBu or tBu; the abbreviation "$N^{R, R'}$, $N^{R''}$, R'''-gnd" or $N^R$, $N^{R''}$-gnd when R=R' and R"=R''' refers to the guanidinate ligand [R—N—C(NR"R''')=NR'], wherein R, R', R" and R''' are defined alkyl group such as Me, Et, nPr, iPr, nBu, iBi, sBu or tBu. Although depicted here as having a double bond between the C and N of the ligand backbone, one of ordinary skill in the art will recognize that the amidinate, formidinate and guanidinate ligands do not contain a fixed double bond. Instead, one electron is delocalized amongst the N—C—N chain.

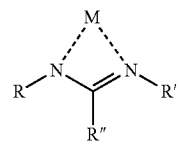

Amidinate ligand

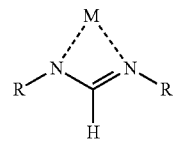

Formamidinate ligand

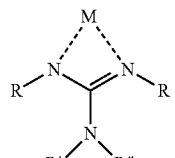

Guanidinate ligand

The standard abbreviations of the elements from the periodic table of elements are used herein. It should be understood that elements may be referred to by these abbreviations (e.g., Mn refers to manganese, Si refers to silicon, C refers to carbon, etc.). Additionally, Group 3 refers to Group 3 of the Periodic Table (i.e., Sc, Y, La, or Ac). Similarly, Group 4 refers to Group 4 of the Periodic Table (i.e., Ti, Zr, or Hf) and Group 5 refers to Group 5 of the Periodic Table (i.e., V, Nb, or Ta).

Any and all ranges recited herein are inclusive of their endpoints (i.e., x=1 to 4 or x ranges from 1 to 4 includes x=1, x=4, and x=any number in between), irrespective of whether the term "inclusively" is used.

Please note that the films or layers deposited, such as silicon oxide or silicon nitride, may be listed throughout the specification and claims without reference to their proper stoichiometry (i.e., $SiO_2$). These films may also contain Hydrogen, typically from 0 at % to 15 at %. However, since not routinely measured, any film compositions given ignore their H content, unless explicitly stated otherwise.

A substrate is understood as the main solid material on which the film is deposited. It is understood that the film may be deposited on a stack of layers that are themselves on the substrate. Substrates are typically but not limited to wafers of silicon, glass, quartz, sapphire, GaN, AsGa, Ge. Substrates may be sheets, typically of metal, glass, organic materials like polycarbonate, PET, ABS, PP, HDPE, PMMA, etc. Substrates may be three-dimensional (3D) objects of similar materials, such as particles. On silicon wafers, typical layers over the substrate may be Ge, SiGe, silicon oxide, silicon nitride, metals (such as Cu, Co, Al, W, Ru, Ta, Ti, Ni), metal silicides and alloys, metal nitrides such as TaN, TiN, VN, NbN, HfN, VN; carbon doped silica films, whether dense or porous, silicon carbo-nitride, amorphous carbon, boron nitride, boron carbonitride, organic materials such as spin-on-carbon, polyimides, photoresists and anti-reflective layers; metal oxides such as oxides of Ti, Hf, Zr, Ta, Nb, V, Mo, W, Al, and lanthanides. The substrates may have topographies like holes or trenches, typically having opening in the range of 5 nm to 100 μm, and usually between 10 nm and 1 μm, and aspect ratio of up to 1:1000, more usually in the range of 1:1 to 1:100.

BRIEF DESCRIPTION OF THE FIGURES

For a further understanding of the nature and objects of the present invention, reference should be made to the following detailed description, taken in conjunction with the accompanying figures wherein.

DESCRIPTION OF PREFERRED EMBODIMENTS

Figure 1:
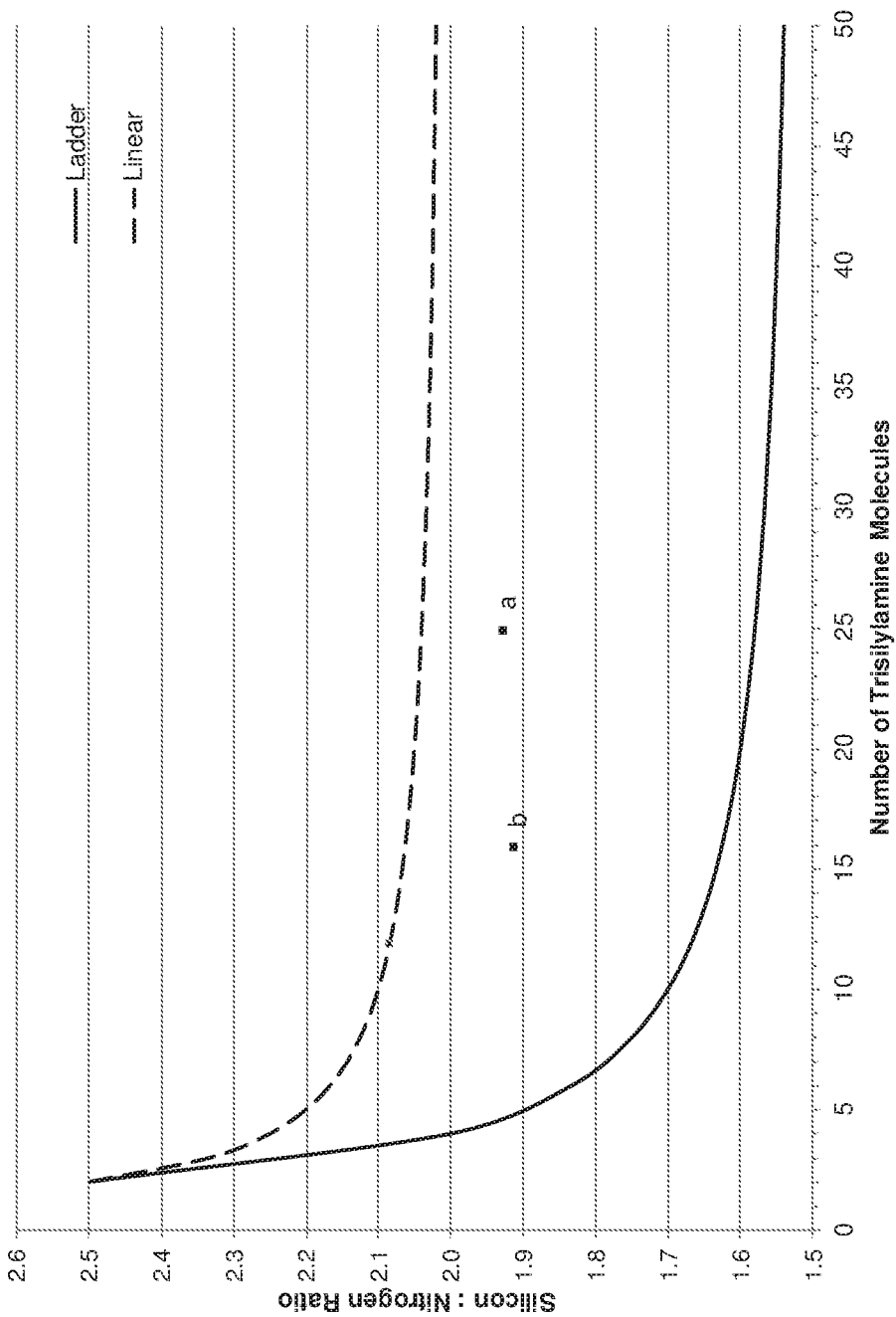
FIG. 1 is a graph of the Si:N ratio versus the number of trisilylamine reactants added to the PHPS composition.

Si-containing film forming compositions are disclosed. The Si-containing film forming compositions comprise a dissolved catalyst and/or a polysilane combined with a N—H free, C-free, and Si-rich perhydropolysilazane (PHPS) having a molecular weight ranging from approximately 332 dalton to approximately 100,000 dalton and comprising N—H free repeating units having the formula [—N(SiH$_3$)$_x$(SiH$_2$-)$_y$], wherein x=0, 1, or 2 and y=0, 1, or 2 with x+y=2; and x=0, 1 or 2 and y=1, 2, or 3 with x+y=3. The Si-containing film forming composition also usually comprise one or more solvents that are chemically inert with respect to the other ingredients of the composition.

The Si-containing film forming compositions comprises between approximately 0.5% wt/wt to approximately 20% w/w of the N—H free, C-free, and Si-rich PHPS in a solvent, and preferably between approximately 1% wt/wt and approximately 10% wt/wt.

Exemplary solvents include hydrocarbons, such as pentane, hexanes, heptanes, benzene, toluene, xylene, mesitylene, other alkanes, or alkane mixes. Other suitable solvents include halohydrocarbons such as dichloromethane or chloroform; ethers such as tetrahydrofuran (THF), or terbutylether, and more generally aprotic solvents, such as acetonitrile, benzene, dimethylformamide, hexamethylphosphoramide, dimethyl sulfoxide, or combinations thereof. Tertiary amines may also be used as a secondary solvent. The solvents should have a boiling point typically comprised between 30° C. and 200° C., more preferably between 70° C. and 150° C. In order to generate dense films, the solvent is selected so as to evaporate during a pre-bake step, typically performed at a temperature ranging from 40° C. to 200° C., preferably between 80° C. and 150° C. The solvent or solvent mixture selection is also guided by the need to dissolve the catalyst. As such, the solvent may be a polar or a non-polar solvent, or a mixture of polar and non-polar solvent. Hydrocarbons, toluene, xylene, mesitylene are typical non-polar solvent, while tertiary amines, ethers and halocarbons are polar solvents.

The Si-containing film forming compositions may also comprise from 0.01% wt/wt to 10% wt/wt of a catalyst, preferably from 0.1% wt/wt to 5% wt/wt, and more preferably from 0.5% wt/wt to 3% wt/wt.

Alternatively, the Si-containing film forming compositions may also comprise between approximately 0.5% wt/wt to approximately 50% w/w of a polysilane, and preferably between approximately 1% wt/wt and approximately 20% wt/wt.

In another alternative, the Si-containing film forming compositions comprises the N—H free, C-free, and Si-rich PHPS, the catalyst, and the polysilane.

The disclosed Si-containing film forming compositions reduce the shrinkage associated with curing of prior art PHPS films into solid materials. The disclosed Si-containing film forming compositions may increase the level of cross linking during the curing step. The disclosed Si-containing film forming compositions may also promote the reaction of the PHPS and the optional polysilane with the curing atmosphere.

Desilylative coupling (DSC) catalysts promote the cross linking of N—H free, C-free, and Si-rich PHPS, rendering it less volatile and prone to releasing fragments that would contribute to the mass loss and film shrinkage.

Dehydrocoupling (DHC) catalysts promote the reaction between the Si—H bonds contained in the NH-free PHPS or/and in the polysilane with H-E bonds (E being N and O) coming from the compounds present in the gas phase during curing. Such gas phase compounds comprise one or more E-H bonds, and are typically H$_2$, H$_2$O$_2$, NH$_3$, hydrazine, secondary amines, ethanolamine, diamines, polyols, and/or polyamines. The DHC catalyst may still promote the cross linking of the polymer with other gas phase compounds free of O—H bonds, such as, O$_2$ or O$_3$. However, the DHC reaction of O$_2$ with Si—H bonds produces H$_2$O and OH radicals, that serve as the E-H bond and further react with the Si-containing polymer.

The disclosed Si-containing film forming composition contain N—H free, C-free, and Si-rich PHPS with no N—H bonds. N—H bonds are often reactive to many catalysts, such as transition metal or metalloid compounds (alkoxy or alkylamino-containing transition metal compounds or metalloid derivatives). As such, a formulation containing the prior art NH-containing PHPS would be unstable in the presence of such catalyst. This instability leads to the formation and precipitation of solid, non-soluble oligomers and polymers. See Pre-Example 2. For semiconductor applications, the presence of such solid particles precludes them from an industrial usage.

The disclosed Si-containing film formulation are particularly suitable for gapfill applications on holes and trenches in semiconductor devices, whether for sacrificial films or leave behind films. The disclosed Si-containing film formulations are capable of filling structures with small openings—typically from 10 to 1000 nm—without voids as required by gapfill applications. Additionally, the disclosed Si-containing film forming compositions may be converted to dense, low-stress, low set etch rate silicon oxide or silicon nitride at the lowest possible temperature. The resulting films may have a uniform composition along the feature depth. The low shrinkage achieved with the claimed film forming composition, the absence of insoluble products and particles owing to the low reactivity of the NH-free PHPS, and its ability to easily convert to a solid and dense film thanks to the catalyst presence, makes such formulation particularly suitable for semiconductor gap fill applications.

N—H Free, C-Free, and Si-Rich PHPS

The N—H free, C-free, and Si-rich PHPS is disclosed in co-pending PCT Application No. PCT/US17/65581. These PHPS compositions comprise N—H free repeating units having the formula [—N(SiH$_3$)$_x$(SiH$_2$-)$_y$], wherein x=0, 1, or 2 and y=0, 1, or 2 with x+y=2; and x=0, 1 or 2 and y=1, 2, or 3 with x+y=3. These PHPS compositions contain little to no N—H bonds because all of the Ns are bonded directly to Si. As shown in Pre-Example 2, the N—H free, C-free, and Si-rich perhydropolysilazanes provide better air stability than the prior art NH-containing PHPS.

The disclosed N—H free, C-free, and Si-rich PHPS compositions are synthesized by catalyzed desilylative coupling of trisilylamine [N(SiH$_3$)$_3$ or "TSA" ] or from similar inorganic (SiH$_3$)$_2$N-terminated N—H free, low MW silazanes (MW<450 amu) (referred to herein as "volatile PHPS"), such as bis(disilylamino)silane (H$_3$Si)$_2$—N—SiH$_2$—N—(SiH$_3$)$_2$. Alternatively, the TSA or volatile PHPS may include partially substituted NR$^1$R$^2$ groups, wherein R$^1$ and R$^2$ are independently selected from a linear or branched C1 to C4 alkyl, provided that the volatile PHPS contains at least two —SiH$_3$ silyl groups.

For instance, the volatile PHPS may include the compounds disclosed in PCT Pub. No. WO2015/047914 to Sanchez et al., including (R$^4$—SiH$_2$—)(R$^3$—SiH$_2$—)—N—SiHR$^5$—NR$^1$R$^2$, wherein R$^1$ and R$^2$ are independently selected from the group of linear or branched C1 to C6 alkyl, linear or branched C1 to C8 alkenyl, linear or branched C1 to C8 alkynyl, C6 to C10 aryl, linear or branched C1 to C6 alkyl ether, silyl, trimethyl silyl, or linear or branched C1 to C6 alkyl-substituted silyl; and R$^3$, R$^4$, and R$^5$ are independently selected from H, linear or branched C1 to C6 alkyl, linear or branched C1 to C8 alkenyl, linear or branched C1 to C8 alkynyl, C6 to C10 aryl, linear or branched C1 to C6 alkyl ether, silyl, trimethyl silyl, or linear or branched C1 to C6 alkyl-substituted silyl. More particularly, the volatile PHPS may include (H$_3$Si)$_2$—N—SiH$_2$—NR$^1$R$^2$, wherein R$^1$ and R$^2$ are independently a linear or branched C1 to C4 alkyl.

TSA is commercially available. The volatile PHPS reactants may be synthesized using the methods disclosed in PCT Application No. PCT/US17/65581 or in PCT Pub. No. WO2015/047914 to Sanchez et al.

The reactants are Si—X free (with X being Cl, I, or Br), thereby limiting any halogen contamination in the resulting N—H free PHPS compositions, as well as preventing formation of any corrosive byproducts or amine/ammonium salts.

The starting reactant, preferably trisilylamine, is mixed with a desilylative coupling catalyst under an atmosphere that is inert to the reactant, for example Ar, N$_2$, H$_2$ or He. The amount of desilylative coupling catalyst will vary depending upon both the starting reactant and the desilylative coupling catalyst selected. The amount of desilylative coupling catalyst required for the reaction may range from 1 ppm mole % to 50 mole %, preferably from 5 ppm mole % to 5 mole %, and more preferably from 10 ppm mole % to 0.1 mole %.

Exemplary desilylative coupling catalysts include commercially available Lewis acids or Lewis bases. The Lewis acids include transition metals and compounds thereof such as metal carbonyls, boron halides, and organoboranes, aluminum halides, alkaline and alkaline earth metals and its compounds, etc. The Lewis acid may be in its homogeneous or heterogeneous phase and may be affixed to a support (like carbon, Al$_2$O$_3$, polymer, resin, etc.). Specific Lewis acids include triarylboranes having the formula BR$_3$, wherein R is an aryl or substituted aryl group having 6 to 12 carbon atoms, including but not limited to B(C$_6$F$_5$)$_3$, B(C$_6$FH$_4$)$_3$ or BPh$_3$. The Lewis bases include amines, phosphines, ethers, thioethers, halides, alkynes, arenes, etc. Specific Lewis bases include Ph$_2$PCl 1,4-diazabicyclo[2.2.2]octane (DABCO), ethyldimethylamine (EtMe$_2$N), triethylamine (Et$_3$N), diethylamine (Et$_2$NH), di-isopropyl amine (iPr$_2$NH), isopropyl amine (iPrNH$_2$), heterogeneous desilylative coupling catalysts such as palladium on carbon (Pd/C), platinum on carbon (Pt/C), platinum on aluminum (Pt/Al), or homogeneous desilylative coupling catalysts such as Co$_2$(CO)$_8$, Ru(CO)$_{12}$, and other Co or Ru carbonyls containing compounds, 1,4-bis(diphenylphosphino)butane ruthenium (II) chloride, (2-aminomethyl)pyridine [RuCl$_2$((AMPY(DPPB))], Rh(PPh$_3$)$_3$, chloro[(R,R)-1,2-diphenyl-N1-(3-phenylpropyl)-N2-(p-toluenesulfonyl)-1,2-ethanediamine] ruthenium [(R,R)-teth-TsDpenRuCl], PdCl$_2$, methyl iodide (MeI), tetrabutylphosphonium chloride (TBPC), or combinations thereof.

Preferably, the desilylative coupling catalyst is chloride free to prevent chloride contamination in the resulting N—H free PHPS compositions. Exemplary chloride free desilylative coupling catalysts include B(C$_6$F$_5$)$_3$, B(C$_6$FH$_4$)$_3$, BPh$_3$, 1,4-diazabicyclo[2.2.2]octane (DABCO), palladium on carbon (Pd/C), platinum on carbon (Pt/C), platinum on aluminum (Pt/Al), Co$_2$(CO)$_8$, Ru$_2$(CO)$_8$, (2-aminomethyl)pyridine, or combinations thereof.

The desilylative coupling catalysts selected will depend upon the starting reactant and the desired use of the N—H free PHPS composition. For example, TSA and 0.2 mol % B(C$_6$F$_5$)$_3$ neat produce a solid PHPS (MW>>1000) in 5 minutes at room temperature. Addition of a pentane solvent slows the reaction time to 17 hours at the same temperature. Changing the starting reactant from TSA to (H$_3$Si)$_2$—N—SiH$_2$—N—(SiH$_3$)$_2$ results in a PHPS oil after 1 week. The PHPS oil produced in 1 week from the (H$_3$Si)$_2$—N—SiH$_2$—N—(SiH$_3$)$_2$ starting material has a lower molecular weight than the solid PHPS produced from TSA in pentane. In all three reactions, 100% of the starting reactant was consumed as determined by gas chromatography. However, changing from 0.2 mol % of the B(C$_6$F$_5$)$_3$ Lewis acid catalyst to 2-5 mol % of a BPh$_3$ Lewis acid catalyst only produces (H$_3$Si)$_2$—N—SiH$_2$—N—(SiH$_3$)$_2$, and less than approximately 1% of the TSA starting reactant is converted after 1 week at room temperature. Lewis bases such as P(Tolyl)$_3$, P(Ph)$_3$, supported P(Ph)$_3$, and Et$_3$N were less successful and would require a longer reaction time or higher temperature to proceed.

Applicants have also found that the activity of a desilylative coupling catalyst may be enhanced by the addition of a Lewis base, such as a tertiary amine. The Lewis base is selected so as not to be reactive with the starting material (TSA or other volatile PHPS) and/or by the presence of a solvent that at least partially solubilises the catalyst. The Lewis base may simultaneously serve as the solvent and enhance the catalyst activity.

The reactant and the desilylative coupling catalysts may be mixed neat or in a solvent. Exemplary solvents include hydrocarbons, such as pentane, hexanes, heptanes, benzene, toluene, other alkanes, or alkane mixes. Other solvents include halohydrocarbons such as dichloromethane or chloroform; ethers such as tetrahydrofuran (THF), or terbutylether, and more generally aprotic solvents, such as acetonitrile, benzene, dimethylformamide, hexamethylphosphoramide, dimethyl sulfoxide, or combinations thereof. As shown in the examples that follow, the solvent may be used to slow the reaction process. Alternatively, the desilylative coupling catalyst and/or starting reactant may be soluble in the solvent. The desilylative coupling catalyst becomes more efficient and the reaction may proceed more quickly when soluble in the solvent. The solvent may also affect the rate of intramolecular vs. intermolecular de-silylative coupling, and hence affect the $SiH_2$:$SiH_3$ and Si:N ratio of the product. For example, the PHPS reaction product has limited solubility in some alkanes, such as pentane. As a result, reactions in pentane produce lower molecular weight PHPS reaction products. In contrast, the PHPS is more soluble in aromatic hydrocarbons, such as toluene. Therefore, reactions in toluene produce higher molecular weight PHPS reaction products. One of ordinary skill in the art would be able to choose the appropriate solvent to arrive at the desired PHPS reaction product.

The desilylative coupling catalyst may be added to a vessel containing the reactant. Alternatively, the reactant may be added to a vessel containing the desilylative coupling catalyst (inverse addition). In another alternative, the reactant and desilylative coupling catalyst may be added to the vessel simultaneously. In yet another alternative, the desilylative coupling catalyst may be added to a vessel containing a portion of the reactant with the remaining portion of the reactant added to the desilylative coupling catalyst/reactant mixture in the vessel. In all four embodiments, the rate of addition will depend upon the desired PHPS reaction product.

Synthesis of the disclosed N—H free PHPS compositions may take place at any suitable temperature, provided that the temperature remains below the temperature at which the PHPS reaction product decomposes or results in thermal breakage of any Si—N or Si—H bonds. For practical reasons, it is advisable to run the reaction at a temperature lower than the boiling point of TSA (52° C.) or $(SiH_3)_2$—N—$SiH_2$—N—$(SiH_3)_2$ (hereinafter "BDSASi") (103° C.). For example, for the solid PHPS composition produced from TSA and 0.2 mol % $B(C_6F_5)_3$ neat in 5 minutes at room temperature, it may be desirable to slow the reaction by using a temperature cooler than room temperature, for example, ranging from approximately −78° C. to approximately 0° C. In contrast, heat may be required to speed up some of the slower reactions. For example, the temperature may range from approximately 28° C. to approximately 50° C. for some of the synthesis reactions. For other reactions, room temperature (i.e., approximately 18° C. to approximately 24° C.) may be suitable. In another alternative, the reaction may be run at a temperature ranging from approximately −10° C. to approximately 27° C. One of ordinary skill in the art will recognize that higher reaction temperatures may increase the reaction rate of the PHPS synthesis. Higher reaction temperatures may also produce larger molecular weight products by inducing cross-linking by intermolecular desilylation (between oligomers), yielding more cross linked, higher $SiH_2$:$SiH_3$ ratio oligomers, or branched products.

As shown in the examples that follow, the initial desilylative polymerization reaction of TSA to BDSASI occurs rapidly. In comparison, subsequent desilylative polymerization of BDSASI to larger PHPS compositions occurs more slowly. Applicants believe that the polymers may be formed by sequential reaction at the terminal $SiH_3$ units:

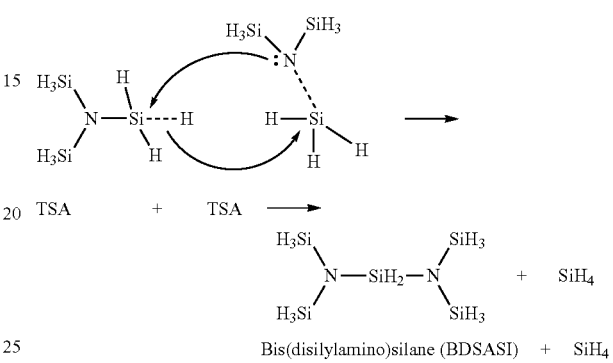

As the reaction continues, the chain length of the PHPS composition increases:

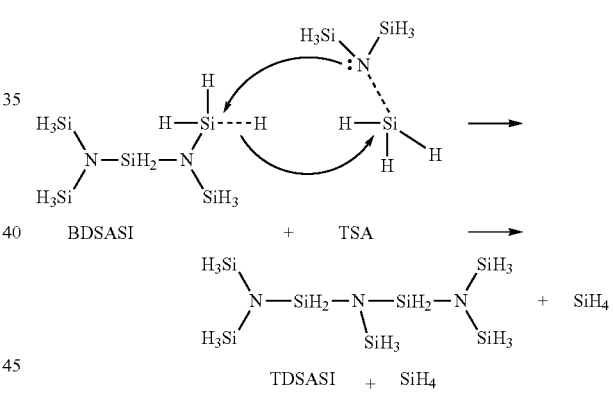

The reaction may proceed linearly:

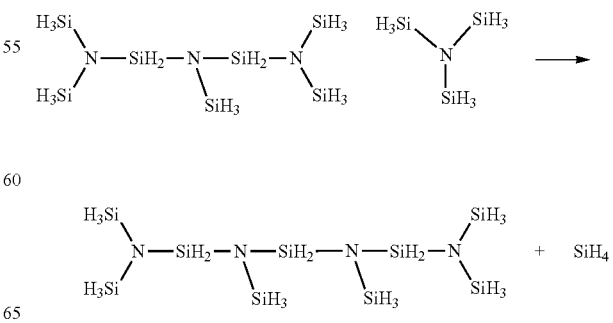

or in a branched manner

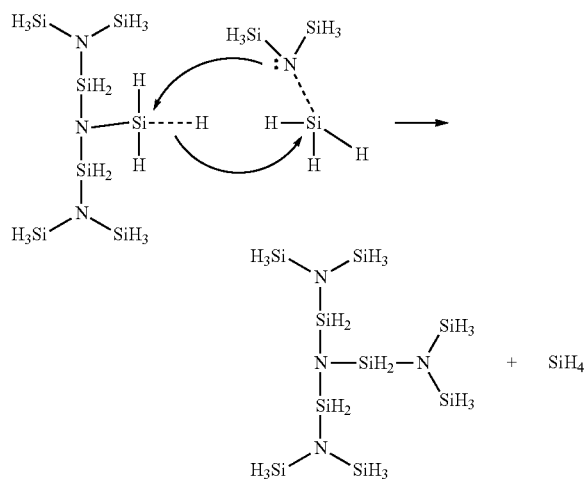

intermolecular reactions:

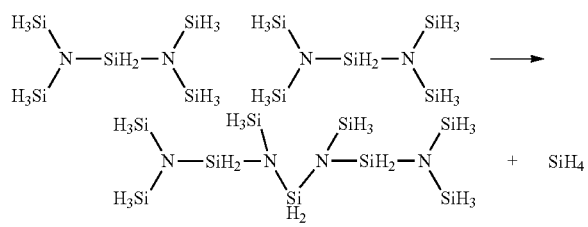

or intramolecular reactions may also occur:

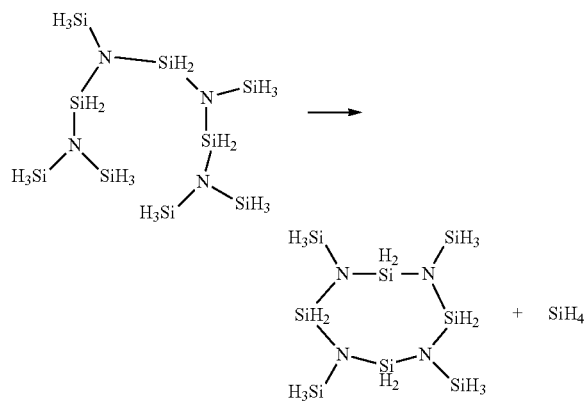

As can be seen, these reactions generate a SiH$_4$ byproduct, which may be cryotrapped and further used as needed, or vented from the reactor and discarded.

As can also be seen, these reactions lead to reaction products that have only —SiH$_2$— and —SiH$_3$ groups (no —SiH— groups).

If desired, the reaction may optionally be quenched (terminated) prior to 100% consumption of the starting reactant or to stop intra or intermolecular desilylative coupling reactions between —SiH$_3$ moieties. For example, when the appropriate molecular weight (MW) or MW distribution is achieved, the desilylative coupling catalyst activity may be quenched by the addition of a coordinate compound such as XNR$_4$ (X=F, C, Br, I; R=alkyl), R—CN, R$_2$S, PR$_3$, etc. Alternatively, a tertiary amine, such as NR$_3$, with R=C1-C6 hydrocarbon, may be used. Preferred tertiary amines include NEt$_3$ and NBu. Applicants believe that heavier amines (i.e., when R=C3-C6) may provide a more stable PHPS composition.

A NMR, IR, and/or Raman spectrometer may be used to monitor the progress of the reaction in situ to determine when the quenching agent is needed. Alternatively, the quenching agent may stop the reaction based upon the time determined in previous experiments. In another alternative, the quantity and type of starting materials may be selected so that permitting the reaction to go to completion produces the desired product. The earlier the quenching agent is added to the reaction, the lower the MW distribution of the PHPS product.

Depending upon the intended use of the product, the PHPS compositions may comprise a combination of the [—N(SiH$_3$)$_x$(SiH$_2$-)$_y$] units, the starting reactant, the desilylative coupling catalyst, the solvent, the quenching agent, and/or any other components required for the intended use.

Alternatively, the PHPS compositions may consist essentially of the [—N(SiH$_3$)$_x$(SiH$_2$-)$_y$] units. In this context, the term "consist essentially of" means that the PHPS composition contains approximately 90% w/w to approximately 98% w/w of the [—N(SiH$_3$)$_x$(SiH$_2$-)$_y$] units, with only a total of approximately 2% w/w to approximately 10% w/w of any remaining components of the reaction mixture.

In another alternative, the PHPS compositions may consist of only the [—N(SiH$_3$)$_x$(SiH$_2$-)y] units, or between approximately 98% w/w and 100% w/w of [—N(SiH$_3$)$_x$(SiH$_2$-)y] units alone.

When the [—N(SiH$_3$)$_x$(SiH$_2$-)y] units form a liquid, the liquid may be isolated from the reaction mixture by stripping the volatile components (solvent, low MW compounds) and/or by filtration of the desilylative coupling catalyst (for heterogeneous catalysts) or any non-soluble quenched desilylative coupling catalyst. Further treatment may further help reduce the desilylative coupling catalyst content, which is desirable for the long term stability of the PHPS containing final formulation. For example, the liquid composition may be passed over an adsorbent, such as amorphous carbon, or an ion exchange resin, such as the product sold by Rohm&Haas under the trademark Amberlyst™. When the [—N(SiH$_3$)$_x$(SiH$_2$-)$_y$] units form a solid, the solid may be isolated from the reaction mixture by filtration. In such instances, the usage of liquid the desilylative coupling catalysts is preferred for the synthesis of solid PHPS as it may be removed by filtration (simultaneously with the solvent, if a solvent is also used).

The synthesis methods may be performed using equipment components known in the art. Some level of customization of the components may be required based upon the desired temperature range, pressure range, local regulations, etc. Exemplary equipment suppliers include Buchi Glass Uster AG, Shandong ChemSta Machinery Manufacturing Co. Ltd., Jiangsu Shajabang Chemical Equipment Co. Ltd, etc.

To be suitable for coating methods, the PHPS composition should have a molecular weight ranging from approximately 500 to approximately 1,000,000, preferably from approximately 1,000 to approximately 200,000, and more preferably from approximately 3,000 to approximately 100,000.

N—H Free PHPS

As demonstrated in co-pending PCT Application No. PCT/US17/65581, the N—H free, C-free, and Si-rich PHPS is free of any N—H bonds, owing to the fact that it is not formed by ammonolysis, and that the starting materials (TSA, BDSASi, or other volatile PHPS reactants) are also N—H-free. In other words, these reactions do not require or use an ammonia ($NH_3$) reactant. Applicants believe that the $NH_3$ reactant may serve as the origin of the N—H bond contained in the prior art PHPS compositions. The use of the TSA reactant and lack of $NH_3$ reactant in the disclosed synthesis processes eliminates the need to remove any halide by products and/or reduce the amount of H by further processes.

Applicants believe that the absence of N—H in the N—H free, C-free, and Si-rich PHPS may make conversion of the PHPS to $SiO_2$ easier at lower temperatures than the prior art N—H containing PHPS compositions.

Applicants believe that the absence of N—H in the N—H free, C-free, and Si-rich PHPS makes the claimed PHPS less reactive to air and water than prior art perhydropolysilazanes. This is partially demonstrated in Pre-Example 2. This lower reactivity may permit spin on oxide deposition to be performed in air rather than in an inert atmosphere. This alone would significantly reduce the cost of manufacture. Additionally, the N—H free, C-free, and Si-rich PHPS is more stable than prior art perhydropolysilazanes. The prior art N—H containing perhydropolysilazanes may undergo cross-linking between the N—H and the Si—H, resulting in the release of $H_2$, and therefore requires cold storage. As a result, storage of the disclosed Si-containing film forming compositions will be easier and safer than that of the prior art N—H containing perhydropolysilazanes. The lower reactivity may also reduce the number of defects that result from uncontrolled oxidation. As shown in Pre-Example 2, the prior art perhydropolysilazane became cloudy when exposed to air. The cloudiness results from the colloidal suspension of particles and particles are well known to be detrimental in the semiconductor industry.

Si:N Ratio

Whether linear, branched, or a mixture of both, the Si:N ratio decreases from a maximum of 3:1 for the TSA reactant (i.e., 3 Si:1 N) to 2.5:1 for BDSASI (i.e., 5 Si:2 N) to a minimum of 1.5:1 (see structure below in which all Ns attach to 3 $SiH_2$ and all $SiH_2$ attach to 2 N, producing the minimum 3 Si: 2 N or 1.5 Si:N ratio) as the size of the N—H free, C-free, and Si-rich PHPS increases.

When N—H free, C-free, and Si-rich PHPS is formed solely by successive desilylative coupling without any intramolecular coupling of 2 $SiH_3$ belonging to the same molecule, the Si:N ratio ranges between 2.5:1 (BDSASi) and 2:1 (i.e., for an infinite linear polymer having (—$SiH_2$—N($SiH_3$)—)$_n$ structure or fully branched structure with $SiH_2$ only in the center and $SiH_3$ at the end of the chains).

A fully desilylated N—H free, C-free, and Si-rich PHPS having undergone intramolecular desilylative coupling between all its —$SiH_3$ groups (idealized by the infinite ladder case below for instance) would have a Si:N ratio of 1.5:1, as each —$SiH_2$— is bonded to 2 N, and each N is bonded to 3 Si.

In another alternative, the polymer or oligomer may contain cyclic units formed from 3 or more (—N($SiH_2$ or 3)$SiH_2$—) units. Such oligomers would have an Si:N ratio in between the ladder structure below (i.e., Si:N>1.5:1) but equal to or below the purely linear case for a polymer having the same number of N atoms (i.e., Si:N≤2:1).

This phenomenon is depicted in FIG. 1, which shows the Si:N ratio on the y axis and the number of trisilylamine reactant additions on the x axis. As can be seen in FIG. 1, the curve becomes an asymptote approaching Si:N ratio of 2:1 for linear PHPS reaction products and 1.5:1 for cross-linked PHPS reaction products.

The N—H free, C-free, and Si-rich PHPS has a Si:N ratio ranging from between 2.5:1 and 1.5:1, preferably between 2.5:1 and 1.75:1, but no less than 1.5:1.

The disclosed Si-containing film forming compositions may be used to form silicon oxide films used for semiconductor applications. US Pat. App. Pub. No. 2015/004421 to Fujiwara et al. demonstrates that the usage of a Si-rich PHPS (i.e., having an Si:N ratio higher than the 1:1) is beneficial to achieve low shrinkage of the film obtained by spin-on and oxidative annealing. Fujiwara et al. obtain a higher than 1:1 Si:N ratio by forming the PHPS in a halosilane excess (so that the PHPS still contains Si—Cl bonds). Fujiwara et al. further process the partially chlorinated PHPS oligomers at temperatures ranging from 40–200° C., and preferably 100-200° C., to further react the Si—Cl with N—H moieties of the polymer, hence trying to create —($SiH_2$)$_2$N$SiH_2$— structures in the polymer. Id. at paras 0036-0037 and 0043. Alternatively, Fujiwara et al. add a halosilane to the NH-containing PHPS to yield a similar result. Id. at para 0038. Still, Fujiwara's method suffers from the need to process a chlorinated silane (hence the formation of $NH_4$Cl solid in Example 3), and limits the effective Si:N ratio to 1.4:1. Id. at Table 1. The PHPS also still contains N—H moieties, and hence subject to instability from Si—H/N—H elimination yielding further cross linking and evolution of the molecular weight distribution.

The disclosed Si-containing film forming compositions may also be used to form silicon nitride films. The wet etch rate of silicon nitride films used in the semiconductor industry by a HF-based solution depends upon the Si:N ratio and on the H concentration of the silicon nitride film (Longjuan et al., Journal of Semiconductors, Vol. 30, No. 9, September 2009). Longjuan et al. decreased the silicon nitride etch rate by (a) increasing the Si:N ratio of the film through optimization of the deposition parameters (i.e., increasing the $SiH_4$ gas flow rate and/or decreasing the $NH_3$ and $N_2$ gas flow rate) and (b) releasing H after film formation using high temperature rapid thermal annealing (RTA). Id. However, Hirao et al. disclose that annealing silicon nitride films reduces H concentration via loss of H from N—N and Si—H bonds, not from N—H bonds. Japanese Journal of Applied Physics, Vol. 27, Part 1, Number 1. The disclosed Si-containing film forming compositions may be used to produce silicon nitride films having few to no N—H bonds, permitting the subsequent removal of any remaining H in the film via annealing. Applicants believe that the lack of N—H bonds in the silicon nitride may permit lower temperature annealing and/or faster UV curing than required for films containing N—H bonds. More particularly, the disclosed Si-containing film forming compositions produce silicon nitride films having a wet etch rate equal or below half the etch rate of thermally grown silicon oxide using a dilute HF solution (0.5 to 1% HF), preferably below ⅒th.

As such, the disclosed Si—X free process produces a N—H free, C-free, and Si-rich PHPS composition having a high Si:N ratio and free of N—H moieties in order to yield silicon oxide or silicon nitride with low shrinkage, and low stress silicon oxide.

$SiH_2$:$SiH_3$ Ratio

The N—H free, C-free, and Si-rich PHPS has a $SiH_2$:$SiH_3$ ratio ranging from 1:4 (BDSASI) to 1:0, preferably ranging from 1:2.5 to 1:0, and more preferably ranging from 1:2 to 1:0. The minimum $SiH_2$:$SiH_3$ ratio in the N—H free, C-free, and Si-rich PHPS is 1:4 for BDSASI. During the synthesis of the NH-free PHPS polymer, successive desilylative coupling with the TSA reactant occurs, the ratio converges towards 1:1 (—$SiH_2$—$N(SiH_3)$—) repeating units. Eventually, intermolecular or intramolecular desilylative coupling between —$SiH_3$ groups within an oligomeric molecule or between 2 oligomeric molecules further reduces the $SiH_2$:$SiH_3$ ratio to below 1:1, potentially down to 1:0 in the case of an infinite polymer in which all N are bonded to 3 —$SiH_2$—, yielding a polymer having an average composition of $N(SiH_2-)$. An example of such an oligomer structure is provided below:

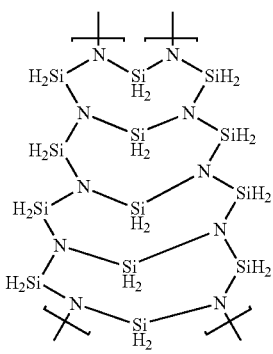

When N—H free, C-free, and Si-rich PHPS has this ladder structure, the $SiH_2$:$SiH_3$ ratio approaches 1:0 (limited only by any terminal $SiH_3$ groups) as the length of the oligomer or polymer increases. At the same time, the Si:N ratio tends to converge towards 1.5:1, but never below 1.5:1. As a result, the $SiH_2$:$SiH_3$ ratio helps determine the amount of cross-linking exhibited by the N—H free, C-free, and Si-rich PHPS. In practice, the maximum $SiH_2$:$SiH_3$ ratio that maintains a liquid N—H free, C-free, and Si-rich PHPS is typically 5:1, and the desired range is 2.5:1 to 4.5:1.

Additionally, N—H free, C-free, and Si-rich PHPS does not contain any silicon atoms attached to a single H atom (i.e., —Si(—)(H)—) so long as not heated to a temperature that will induce Si—H cleavage. In other words, all Si atoms in the PHPS are bonded to a minimum of 2H atoms (i.e., $SiH_x(N-)_{4-x}$, wherein x is 2-3).

PHPS film shrinkage during oxidative curing is closely related to the degree of PHPS polymer cross-linking. The degree of PHPS polymer cross-linking is represented by the molar ratio of $(SiH_1+SiH_2)/SiH_3$. The higher the $(SiH_1+SiH_2)/SiH_3$ ratio, the more cross-linked the PHPS polymer is, and thus the lower the film shrinkage is. See Tables 1 and 4 of US Pat App Pub No 2016/0379817 to Okamura et al.

One of ordinary skill in the art will recognize that $^1H$ and/or $^{29}Si$ NMR spectroscopic integration may be used to determine the quantity of —Si(—)(H)—, —$SiH_2$, and —$SiH_3$ in the N—H free, C-free, and Si-rich PHPS.

Catalysts

One or more catalysts may be included in the disclosed Si-containing film forming compositions. As discussed above, the Si-containing film forming compositions may also comprise from 0.01% wt/wt to 10% wt/wt of a catalyst, preferably from 0.1% wt/wt to 5% wt/wt, and more preferably from 0.5% wt/wt to 3% wt/wt.

The catalysts may be selected for different purposes depending on the application of the Si-containing film forming composition. The catalysts are activated to help reduce film shrinkage during the deposition process:

De-silylative coupling catalysts may be added to further cross link the N—H free, C-free, and Si-rich PHPS during curing. The desilylative coupling catalysts suitable for use in the Si-containing film forming composition function in the same manner as those used during synthesis of the N—H free, C-free, and Si-rich PHPS (i.e., creation of $SiH_2$—N—$SiH_2$ bonds and release of $SiH_4$). However, the desilylative coupling catalysts in the Si-containing film forming composition should be selected to have little to no activity at normal storage in order to avoid reactions and hazardous $SiH_4$ release during storage. As such, the desilylative coupling catalysts suitable for inclusion in the disclosed Si-containing film forming compositions must be selected to only have a significant catalytic activity starting at temperatures ranging from approximately 50° C. to approximately 200° C. and/or under other activation means such as photons. Such catalysts may be useful to reduce shrinkage both for silicon oxide and silicon nitride applications.

De-hydrogenative coupling (DHC) catalysts may be added to favor the formation of $H_2$ by the reaction of the E-H containing species present in the curing atmosphere and Si—H from the N—H free, C-free, and Si-rich PHPS (E=O, N). These catalysts are both useful for the formation of silicon oxide and silicon nitride films. These catalysts will add mass (by addition of "N" or "O" and loss of $H_2$) to the film during the curing, and thus contribute to offset or limit the shrinkage of the film. In OH-free oxidative atmospheres, such as $O_2$, $O_3$, NO, or $N_2O$, such catalyst will also enhance the film conversion to silicon oxide as the reaction by-products between the gaseous species and the film forming composition will create OH containing species.

The DSC and DHC catalysts mechanism for nitride films are shown below:

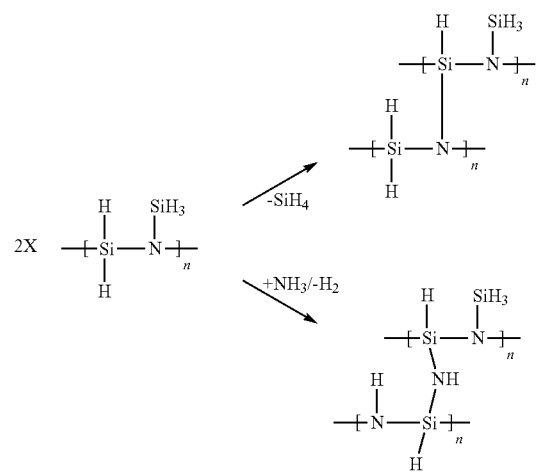

One of ordinary skill in the art will recognize that some catalysts may perform both DHC and DSC catalysis.

As can be seen, DSC removes a "larger" portion of the Si-containing film forming composition (i.e., DSC removes $SiH_4$ while DHC only removes $H_2$). As a result, under an inert curing atmosphere, Applicants believe that inclusion of a DHC catalyst in the Si-containing film forming composition will result in less film shrinkage than inclusion of a DSC catalyst.

However, curing frequently occurs in an oxidizing or nitridizing atmosphere. Both DHC and DSC catalysts are suitable for formation of oxide or nitride films under an oxidizing or nitridizing atmosphere, respectfully. As described above, the DHC catalyst may also react with the oxidizing or nitridizing atmosphere to insert O or NH into the resulting film:

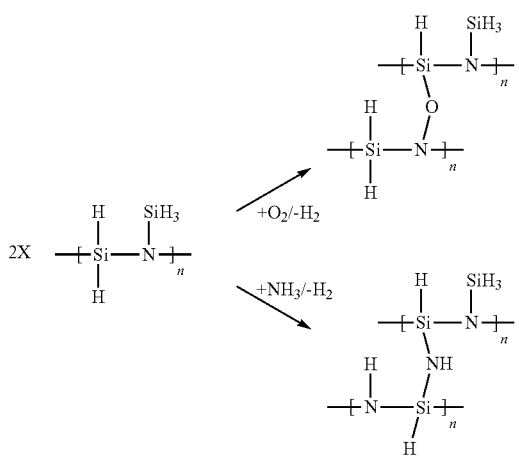

The catalysts have little to no reactivity with the N—H free, C-free, and Si-rich PHPS prior to activation of the catalyst. In contrast, reaction of the prior art NH-containing PHPS may begin upon addition of the catalyst and cascade until becoming a gel. As a result, the N—H free, C-free, and Si-rich PHPS offers wider catalyst compatibility than NH containing PHPS.

While Applicants have avoided inclusion of NH in the N—H free, C-free, and Si-rich PHPS, addition of NH to the nitride film may be necessary during curing.

Ideal stoichiometric silicon nitride films are $Si_3N_4$ (i.e., Si:N ratio of 3:4 or 0.75:1). As described above, the disclosed N—H free, C-free, and Si-rich PHPS have a minimum Si:N ratio of 1.5:1. Therefore, the amount of Si in the N—H free, C-free, and Si-rich PHPS must be reduced or the amount of N must be increased during the curing process in order to form ideal stoichiometric silicon nitride films.

Pyrolysis (i.e., curing in an inert atmosphere) of the N—H free, C-free, and Si-rich PHPS leads to elimination of H and H-rich fragments to form non-stoichiometric silicon-rich silicon nitride films. Pyrolysis without addition of matter from the curing environment would shrink the film thickness by at least 50%, which is the density ratio between the N—H free, C-free, and Si-rich PHPS and the silicon rich nitride (i.e., N—H free, C-free, and Si-rich PHPS has an initial density of approximately 1.5 g/mL and partially hydrogenated silicon nitride has a density of approximately 3 g/mL).

DSC catalysts may be used to remove $SiH_4$ from the N—H free, C-free, and Si-rich PHPS to move the Si:N ratio from 1.5:1 to 3:4, but that will also result in mass loss and film shrinkage.

In order to avoid shrinkage and yield films closer to the Si:N 3:4 ideal, N from a curing gas must be inserted in the film. DHC catalysts may be used in a N-containing atmosphere to insert N into the silicon nitride film. As shown above, DHC catalyzes the reaction between Si—H in the film and N—H in the atmosphere to produce Si—N and $H_2$. When the curing gas is $NH_3$, Si—H bonds are first replaced by Si—$NH_2$. Further catalyzation condenses two adjacent Si—$NH_2$ to form Si—NH—Si and $NH_3$. Alternatively or additionally, $SiNH_2$ may react with adjacent Si—H to form Si—NH—Si and $H_2$.

For all of these reasons, the presence of a DHC catalyst in the Si nitride film forming compositions and of —NH containing species in the curing gas is critical to prevent silicon nitride film shrinkage.

Exemplary commercially-available catalysts, depending on the desired reaction promotion, may be selected from the non-limiting table below:

| Catalyst | DSC | Si—N DHC | Si—O DHC (film oxidation) | Comments |
|---|---|---|---|---|
| $ML_4$ (M = Ti, Zr, Hf, W) | | Preferred | Preferred | L independently selected from R, $NR_2$, $PR_3$, arene, OR, SR, Cp, RxCp, $OSiR_3$, pyrazolate, am idinate, with R = C1 to C4 hydrocarbon. 3 ligands may be grouped to form an atrane or an azatrane |
| M(=L1)(L2)$_3$ (M = Group V elements) | | Preferred | Preferred | L1 selected from =N—R, L2 selected independently from R, $NR_2$, $PR_3$, arene, OR, SR, CID, RxCp, $OSiR_3$, pyrazolate, amidinate, 3 ligands can be grouped to form an atrane or an azatrane |
| M(=L1)2(L2)$_2$ (M = Group VI elements) | | Preferred | Preferred | L1 selected from =N—R, L2 selected independently from NR2, PR3, arene, OR, SR, Cp, RxCp, $OSiR_3$, pyrazolate, amidinate |

-continued

| Catalyst | DSC | Si—N DHC | Si—O DHC (film oxidation) | Comments |
|---|---|---|---|---|
| $M_x(CO)_yL_z$ (M = Co, Ru, W, Mo, Ni, Fe, Cr, Ir, Os, Rh) | Preferred | Preferred | | L(optional) = $PR_3$, $NR_2$, $NR_3$, CO, pyridines, arenes, trialkylsilyl, a diene, an acetylenic compound. |
| $BR_3$ | | Preferred | | Boranes R independently selected from H, aryl, alkyl, perfluoro aryl, fluoro aryl, $NR_2$ |
| $FNR_4$ (R = alkyl) | | Preferred | Preferred | Tetraalkyl Ammonium fluorides are very active DHC catalysts |
| $AlL_3$, $AlL_3$:A | Preferred | | | L = alkyl, OR, $NR_2$, Halide; A = $NR_3$, $SR_2$, $OR_2$. The 3 ligands can be grouped to form an atrane or an azatrane. |
| $XPR_4$ | Preferred | | | (X = Cl, Br, F; R = alkyl, aryl) (i.e. TBPC) |
| $M_2(Arene)_2X_4$ | Preferred | Preferred | | M = Ru, Os, Rh, Ir; X = halide, OR |
| Wilkinson's Catalyst [$RhCl(PPh_3)_3$] | Preferred | Preferred | Preferred | |
| Baratta Catalyst [$RuCl_2(DPPB)(AMPY)$] | Preferred | Preferred | Preferred | |
| Organic strong Bases (diamines, triamines) | | | Preferred | Examples: DABCO, trimethylene-diperidine, ethylene diamine |

Exemplary MU (M=Ti, Zr, Hf, W) catalysts include $M(NR_2)_4$, with each R independently a C1 to C4 hydrocarbon. More specifically, the catalysts may be $Zr(NMe_2)_4$, $Zr(NMeEt)_4$, $Zr(NEt_2)_4$, $Ti(NMe_2)_4$, $Ti(NMeEt)_4$, $Ti(NEt_2)_4$, $Hf(NMe_2)_4$, $Hf(NMeEt)_4$, $Hf(NEt_2)_4$, or combinations thereof. Applicants believe that these catalysts may be particularly useful for formation of nitride films due to the amine ligands.

Exemplary MU (M=Ti, Zr, Hf, W) catalysts also include $(R'_5Cp)M(NR_2)_3$, with each R independently a C1 to C4 hydrocarbon and each R' independently H or C1 to C4 hydrocarbon. More specifically, the catalysts may be $CpZr(NMe_2)_3$, $CpZr(NMeEt)_3$, $CpZr(NEt_2)_3$, $(MeCp)Zr(NMe_2)_3$, $(MeCp)Zr(NMeEt)_3$, $(MeCp)Zr(NEt_2)_3$, $CpTi(NMe_2)_3$, $CpTi(NMeEt)_3$, $CpTi(NEt_2)_3$, $(MeCp)Ti(NMe_2)_3$, $(MeCp)Ti(NMeEt)_3$, $(MeCp)Ti(NEt_2)_3$, $CpHf(NMe_2)_3$, $CpHf(NMeEt)_3$, $CpHf(NEt_2)_3$, $(MeCp)Hf(NMe_2)_3$, $(MeCp)Hf(NMeEt)_3$, $(MeCp)Hf(NEt_2)_3$, or combinations thereof. Applicants believe that these catalysts may be particularly useful for formation of nitride films due to the amine ligands.

Exemplary MU (M=Ti,Zr, Hf, W) catalysts also include $(R'_5Cp)MR_2$, with each R independently a C1 to C4 hydrocarbon and each R' independently H or C1 to C4 hydrocarbon. More specifically, the catalysts may be $Cp_2ZrMe_2$, $(MeCp)_2ZrMe_2$, $(EtCp)_2ZrMe_2$, $Cp_2TiMe_2$, $(MeCp)_2TiMe_2$, $(EtCp)_2TiMe_2$, $Cp_2HfMe_2$, $(MeCp)_2HfMe_2$, $(EtCp)_2HfMe_2$, and combinations thereof.

Exemplary $ML_4$ (M=Ti,Zr, Hf, W) catalysts also include $(R'_5Cp)WR_2$, with each R independently a C1 to C4 hydrocarbon and each R' independently H or C1 to C4 hydrocarbon. More specifically, the catalysts may be $Cp_2WEt_2$, $Cp_2WiPr_2$, $Cp_2WtBu_2$, $(iPrCp)_2WEt_2$, $(iPrCp)_2WiPr_2$, $(iPrCp)_2WtBu_2$, $(iPrCp)_2WH_2$, $(iPrCp)_2WMe_2$, and combinations thereof, preferably $(iPrCp)_2WH_2$ and $(iPrCp)_2WMe_2$.

Exemplary $BR_3$ catalysts include $B(phenyl)_3$, $B(CoFH_4)_3$, or very small concentrations $B(C_6F_5)_3$, and combinations thereof, and preferably $B(phenyl)_3$ or $B(C_6FH_4)_3$.

Exemplary $PR_3$ catalysts include $P(Tolyl)_3$, $P(Ph)_3$, and combinations thereof.

Exemplary $M_x(CO)_yL_z$ catalysts include $Co_2(CO)_8$ and $Ru_3(CO)_{12}$. As shown in the examples that follow, $Co_2(CO)_8$ is a particularly preferred catalyst.

The catalysts are selected to be active at lower activation temperatures compatible with the deposition process. Applicants believe that catalytic activity may be initiated as early as the pre-bake process. The catalyst itself will eventually be destroyed during the curing process by reaction with the curing atmosphere, by pyrolysis, or/and by reaction with the film forming composition once it reaches an elevated temperature (typically >200° C.). As a result, traces of the main element of the catalyst may remain in the film in its oxide, nitride or carbide form. Therefore, care must also be taken to select catalysts in which the main element is not detrimental to the properties of the target film. For this reason, Applicants have deliberately avoided alkali, alkaline, and late transition metal catalysts (e.g., Na, K, Cu). The Group IV catalysts are particularly preferred in the Si-containing film forming compositions because any traces will not diffuse throughout the Si-containing film.

Semiconductor manufacturing normally requires that the dielectric films such as SiN and SiO do not contain metallic impurities, especially in the vicinity of the transistor region, so as not to affect the electrical performance of the device. As such, the catalysts are preferably selected for containing elements that are not mobile while embedded in the silicon containing film in an oxidized or nitride form.

For this purpose, the catalysts for films that are meant to remain in the device (i.e., non-sacrificial films) are preferably selected for containing group IV, group V, Group VI elements, Boron or aluminum. Sacrificial films, such as hard masks, tone inversion layers, anti-reflective coatings, etc. and non-semiconductor applications having less film quality impact from metallic impurities may utilize a wider choice of catalysts.

The catalysts used in the film forming composition may require activation, which is generally provided by the heat during the curing step(s), and the combination of a specific atmosphere to lead to the required film. For oxide films, the atmosphere should comprise at least one of $O_2$, $O_3$, $H_2O$, $H_2O_2$, NO, $N_2O$. For nitride films, the atmosphere should comprise at least one of $NH_3$, a hydrazine, substituted hydrazine, primary amines.

Oxynitride films may be obtained by partial curing (i.e. partial conversion of Si—N—Si to Si—O—Si in the film) under an oxidizing atmosphere, or by sequential curing in various oxidizing and nitridizing atmosphere. Activation can also be provided by photon, such as UV curing.

Polysilanes

One or more polysilanes may be included in the disclosed Si-containing film forming compositions. The Si-containing film forming compositions may comprise between approximately 0.5% wt/wt to approximately 50% w/w of the polysilane, and preferably between approximately 1% wt/wt and approximately 20% wt/wt.

The polysilane may be a per-hydrido polysilane, such as $Si_nH_{2n+2}$ for linear or branched compounds and $Si_nH_{2n+2-2m}$ formula for compound with m cycles, with n≥2 and m≥1. More particularly, n may range from approximately 4 to approximately 50, preferably from approximately 10 to approximately 40, and more preferably from approximately 15 to approximately 30.

Alternatively, the polysilane may be a substituted polysilane, such as $Si_nH_{2n+1-m}(NR_2)_m$, with n≥2, m≥1, and each R independently H or a $C_1$-$C_4$ hydrocarbon. For instance, the polysilane may be $Si_3H_7$—$NiPr_2$, which is disclosed in U.S. Pat. No. 9,382,269.

The polysilanes helps to increase the ratio of ($SiH_1$+ $SiH_2$)/$SiH_3$ and the ratio of Si/N in the Si-containing film forming composition.

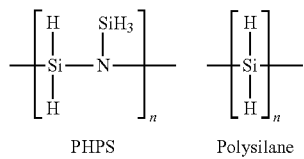

PHPS          Polysilane

The per-hydrido polysilane may be synthesized as disclosed in U.S. Pat. No. 8,163,261 to Hazeltine or US Pat App Pub No 2012/291665 to Wieber et al. The substituted polysilane may be synthesized as disclosed in PCT Pub No WO2015/048237 to Sanchez et al.

The addition of polysilane to the Si-containing film forming composition increases the average density of silicon atoms per unit volume of the pre-baked film. When the film is cured under a reactive atmosphere (oxidizing or nitridizing), the final theoretical Si atom density is that of silicon oxide or silicon nitride, which is lower than the Si atom density of the pre-baked film. As such, an ideal curing process that would proceed without any silicon loss would actually have a negative shrinkage (expand) as it incorporates 0 or N. This phenomena is confirmed in Examples 4 and 5, which shows that the addition polysilane to the Si-containing film forming composition partially offsets some mass loss and indeed reduces film shrinkage.

The presence of a DHC catalyst is synergetic because it works with the Si—H on both the PHPS and on the polysilane.

While not bound by theory, Applicants believe that a partial functionalization of a per-hydrido polysilane by reactive groups like alkylamino groups (i.e. the replacement of an $Si_nH_{2n+2}$ by an $Si_nH_{2n+2-m}(NR_2)_m$) may help to maintain the polysilane in the film during the spin coating process and prevent its entrainment by the solvent. More particularly, the $NR_2$ functional group may help the polysilane remain near the NH-free PHPS and minimize its loss from the wafer during solvent spin coating process.

Storage

The Si-containing film forming composition may be stored under an inert atmosphere in dried glass or stainless steel canisters at temperatures ranging from approximately 0° C. to approximately room temperature. If necessary, the stainless steel canister may be coated and/or passitived to minimize any reaction with the Si-containing film forming composition. As the Si-containing film forming composition includes a catalyst, a safety valve assembly may be necessary to prevent inadvertent leakage of any $H_2$ or $SiH_4$.

Coating Applications

The disclosed Si-containing film forming compositions may also be used in coating deposition processes to form silicon nitride, silicon oxide, or silicon oxynitride films used in the electronics and optics industry. The silicon oxide films are obtained from thermal treatment of the deposited film under an oxidative atmosphere, containing at least one of $O_2$, $O_3$, $H_2O$, $H_2O_2$, NO, $N_2O$, and combinations thereof. The disclosed Si-containing film forming compositions may also be used to form protective coatings or pre-ceramic materials (i.e., nitrides and oxynitrides) for use in the aerospace, automotive, military, or steel industry or any other industry requiring strong materials capable of withstanding high temperatures The Si-containing films may be deposited using any coating methods known in the art. Examples of suitable coating methods include spin coating, dip coating, spray coating, fiber spinning, extrusion, molding, casting, impregnation, roll coating, transfer coating, slit coating, etc. For usage in non-semiconductor applications, the disclosed Si-containing film forming compositions may also contain a ceramic filler, such as BN, SiN, SiCN, SiC, $Al_2O_3$, $ZrO_2$, $Y_2O_3$, and/or $Li_2O$ powders. The coating method is preferably spin coating in order to provide suitable film thickness control and gapfill performance.

The disclosed Si-containing film forming compositions may be applied directly to the center of the substrate and then spread to the entire substrate by spinning or may be applied to the entire substrate by spraying. When applied directly to the center of the substrate, the substrate may be spun to utilize centrifugal forces to evenly distribute the composition over the substrate. One of ordinary skill in the art will recognize that the viscosity of the Si-containing film forming compositions will contribute as to whether rotation of the substrate is necessary. Alternatively, the substrate may be dipped in the disclosed Si-containing film forming compositions. The resulting films may be dried at room temperature for a period of time to vaporize the solvent or volatile components of the film or dried by force-drying or baking or by the use of one or a combination of any following suitable process including thermal curing and irradiations, such as, ion irradiation, electron irradiation, UV and/or visible light irradiation, etc.

The spin-on Si-containing film forming compositions may also be used for the formation of transparent silicon oxynitride films suitable for optics applications.

When used for spin coating, dip coating or spray coating, the disclosed Si-containing film forming compositions may be used for the formation of silicon oxide or silicon nitride barrier layers that are useful as moisture or oxygen barriers, or as passivation layers in displays, light emitting devices and photovoltaic devices.

In semiconductor applications the Si-containing film forming compositions may be used for forming sacrificial layers such as etching hard masks, ion implantation masks, anti-reflective coatings, tone inversion layers. Alternatively, the Si-containing film forming compositions may be used for forming non-sacrificial layers ("leave behind" films), such as gapfill oxide layer, pre-metal dielectric layers, transistor stressing layers, etch stop layers, inter-layer dielectric layers.

For Gap-fill applications, the trench or hole may have an aspect ratio ranging from approximately 3:1 to approximately 100:1. The Si-containing film forming compositions is typically spun on the substrate, pre-baked at 50° C.-200° C. to evaporate the solvent(s), and eventually converted to silicon oxide by annealing the substrate in an oxidizing atmosphere, typically containing $O_2$, $O_3$, $H_2O$, $H_2O_2$, $N_2O$, NO, at a temperature ranging from 300 to 900° C. The oxide quality may be improved by a multi-step annealing process in various atmospheres (oxidative or inert).

Preparation of Si-Containing Film Forming Composition

Figure 2:
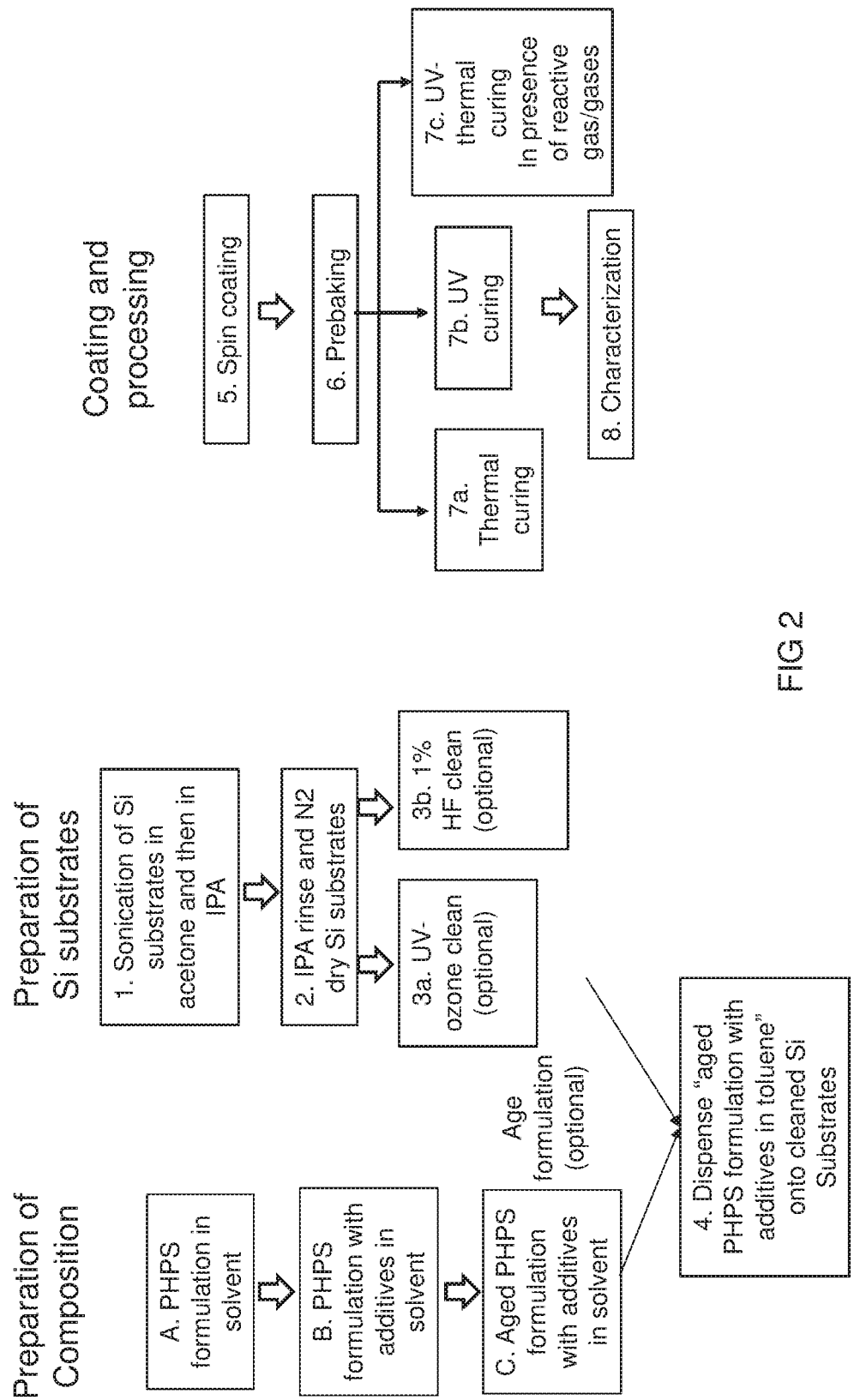
FIG. 2 is a flow chart diagraming exemplary processes for the preparation of the Si-containing film forming compositions, preparation of the silicon substrate, and the steps of the spin-coating process.

FIG. 2 is a flow chart diagraming exemplary processes for the preparation of the Si-containing film forming compositions, preparation of the silicon substrate, and the steps of a spin-coating process. One of ordinary skill in the art will recognize that fewer or additional steps than those provided in FIG. 2 may be performed without departing from the teachings herein. For example, the characterization step utilized in a R&D setting may not be required in commercial operations. One of ordinary skill in the art will further recognize that the process is preferably performed under an inert atmosphere to prevent undesired oxidation of the film and/or in a clean room to help prevent contamination to prevent particle contamination of the film.

In Step A, N—H free, C-free Si-rich PHPS is mixed with the solvent to form a 7-10 wt % mixture. Mixing mechanisms known in the art may be used to mix these two components (e.g., mechanical stirring, mechanical shaking, etc.). Depending on the ingredients, the mixture may be heated to a temperature ranging from 27° C. to approximately 100° C. The heating temperature should always remain lower than the pre-baking temperature. Depending on the specific ingredients, mixing may occur for 1 minute to 1 hour.

In Step B, the optional catalyst, optional polysilane, or both may be added to the mixture and mechanically stirred in the same manner. Depending on the ingredients, the mixture may be heated to a temperature ranging from 27° C. to approximately 100° C. Depending on the specific ingredients, mixing may occur for 1 minute to 1 hour.

In Optional Step C, the mixture may be aged to allow any reaction between the additives and PHPS to reach equilibrium. After mixing, the mixture may age for 1 hour to 2 weeks prior to use. Depending on the ingredients, the mixture may be aged at a temperature ranging from 27° C. to approximately 100° C. For catalyst-containing compositions, the catalyst and PHPS may partially react for a short period of time. Therefore, aging is recommended prior to use to stabilize the composition. Initial aging test results indicate that the composition reaches an equilibrium at which further shrinking of the resulting oxide film does not occur. One or ordinary skill in the art would be able to perform the necessary aging tests to determine the proper aging duration.

After Step B or Optional Step C, the mixture may be filtered to remove any particles or other solid content. One of ordinary skill in the art would recognize that the filter must be compatible with the components of the Si-containing film forming composition. PolyTetraFluoroEthylene (PTFE) is typically a suitable filtration material. The filter size ranges from approximately 0.02 micron to approximately 1 micron.

One of ordinary skill in the art will also recognize that other addition sequences are possible, such as the pre-blending of the catalyst in the solvent or one of the solvents to facilitate the mixing and enable a more homogeneous mixture with the NH-free, C-free PHPS.

Preparation of Substrate

An exemplary process to prepare a substrate for the spin-coating process is also provided in FIG. 2.

The planar or patterned substrate on which the Si-containing film is to be deposited may be prepared for the deposition process in Steps 1 and 2 and Optional Steps 3a and 3b. High purity gases and solvents are used in the preparation process. Gases are typically of semiconductor grade and free of particle contamination. For semiconductor usage, solvents should be particle free, typically less than 100 particles/mL (0.5 μm particle, more preferably less than 10 particles/mL) and free of non-volatile residues that would lead to surface contamination. Semiconductor grade solvents having less than 50 ppb metal contamination (for each element, and preferably less than 5 ppb) are advised.

In Step 1, the substrate is sonicated in acetone at room temperature (between approximately 20° C. and approximately 25° C.) for approximately 60 seconds to approximately 120 seconds, and preferably for approximately 90 seconds. The planar or patterned substrate is then sonicated at room temperature in isopropyl alcohol (IPA) for approximately 60 seconds to approximately 120 seconds, and preferably for approximately 90 seconds. One of ordinary skill in the art will recognize that these steps may be performed in the same or different sonicators. Different sonicators require more equipment, but provide an easier process. The sonicator must be thoroughly cleaned between Step 1 and 2 if used for both to prevent any contamination of the substrate. Exemplary sonicators suitable for the disclosed methods include Leela Electronics Leela Sonic Models 50, 60, 100, 150, 200, 250, or 500 or Branson's B Series.

In Step 2, the substrate is removed from the IPA sonicator and rinsed with fresh IPA. The rinsed substrate is dried using an inert gas, such as $N_2$ or Ar.

In Optional Step 3a, the substrates of Step 2 may be treated by UV-ozone for 1 hour at 25° C. and atmospheric pressure to generated OH-terminated hydrophilic surfaces when a hydrophilic surface is desired. Step 3a also further removes organic contaminations.

In Optional Step 3b, the substrates of Step 2 are dipped into a 1% HF water solution at 25° C. for 1-2 minute to etch away the top native oxide layer, and generate H-terminated hydrophobic surfaces when a hydrophobic surface is desired.

One of ordinary skill in the art will recognize that Steps 1 and 2 and Optional Steps 3a and 3b provide exemplary wafer preparation processes. Multiple wafer preparation processes exist and may be utilized without departing from the teachings herein. See, e.g., Handbook of Silicon Wafer Cleaning Technology, $3^{rd}$ Edition, 2017 (William Andrew). One of ordinary skill in the art may determine the appropriate wafer preparation process based at least upon the substrate material and degree of cleanliness required.

The substrates may proceed to the spin coating process after any of steps 2, 3a, or 3b.

Exemplary Spin-Coating Process

The flow chart of FIG. 2 also diagrams an exemplary spin-coating process.

The substrate prepared above is transferred to the spin coater. Exemplary suitable spin coaters include Brewer Science's Cee® Precision spin coaters, Laurell's 650 series spin coaters, Specialty Coating System's G3 spin coaters, or Tokyo Electron's CLEAN TRACK ACT equipment family. In Step 4, the Si-containing film forming compositions of Step B or C are dispensed onto the substrate of Step 2, 3a, or 3b. The wafer substrate is spun in Step 5. One of ordinary skill in the art will recognize that Step 4 and Step 5 may be performed sequentially (static mode) or concurrently (dynamic mode). Step 4 is performed using a manual or auto-dispensing device (such as a pipette, syringe, or liquid flow meter). When Steps 4 and 5 are performed concurrently, the initial spin rate is slow (i.e., between approximately 5 rpm to approximately 999 rpm, preferably between approximately 5 rpm to approximately 300 rpm). After all of the Si-containing film forming composition is dispensed (i.e., when Step 4 is complete in either static or dynamic mode), the spin rate ranges between approximately 1000 rpm to approximately 4000 rpm. The wafer is spun until a uniform coating is achieved across the substrate, which typically takes between approximately 10 seconds and approximately 3 minutes. Steps 4 and 5 produce a Si-containing film on the wafer. One of ordinary skill in the art will recognize that the required duration of the spin coating process, the acceleration rate, the solvent evaporation rate, etc., are adjustable parameters that require optimization for each new formulation in order to obtain the target film thickness and uniformity (see, e.g., University of Louisville, Micro/Nano Technology Center—Spin Coating Theory, October 2013).

After the Si-containing film is formed, the wafer is pre-baked or soft baked in Step 6 to remove any remaining volatile organic components of the PHPS composition and/or by-products from the spin-coating process. Depending on the activation temperature of the catalyst, catalyzation may also commence in Step 6. Step 6 may take place in a thermal chamber or on a hot plate at a temperature ranging from approximately 30° C. to approximately 200° C., preferably 80° C. to 150° C. for a time period ranging from approximately 1 minute to approximately 120 minutes. Exemplary hot plates include Brewer Science's Cee® Model 10 or 11 or Polos' precision bake plates.

In step 7, the substrate is cured to produce the desired material. 3 non-limiting options are shown in FIG. 2. Any of the 3 options may be performed using an inert or reactive gas. Exemplary inert gases include $N_2$, Ar, He, Kr, Xe, etc. The reactive gas may be used to introduce oxygen, nitrogen, or carbon into the film.

Exemplary reactive gases that introduce oxygen into the film include oxygen-containing gases, such as $O_2$, $O_3$, air, $H_2O$, $H_2O_2$, $N_2O$, NO, etc. Under an $O_2$/Ar, the curing temperature may range for approximately 400° C. to approximately 800° C. O2 may be used as a curing gas because the PHPS in the Si-containing film forming composition is NH free and therefore does not react as quickly with the $O_2$ to form particles (see Pre-Example 2). Alternatively, curing may occur under a $H_2O_2$ at temperatures ranging from approximately 300° C. to approximately 500° C. $H_2O_2$ is a strong oxidizer and may permit consistent Si oxide film consistency further into the trench.

Exemplary reactive gases that introduce carbon into the film include carbon-containing gases, and specifically unsaturated carbon-containing gases, such as alkenes and alkynes (ethylene, acetylene, propylene, etc.).

Exemplary reactive gases that introduce nitrogen into the film must have at least one N—H bond to enable the DHC reaction to proceed. For a completely C-free film, this means that the curing gas may comprise $NH_3$ or $N_2H_4$. Alternatively, C-containing N-sources may be used, but may yield some C in the film. Exemplary C-containing N sources include substituted hydrazines (i.e., $N_2R_4$, wherein each R is independently H or a $C_1$-$C_4$ hydrocarbon provided that at least one R is H) (e.g., $MeHNNH_2$, $Me_2NNH_2$, MeHNNHMe, phenyl hydrazine, t-butyl hydrazine, 2-cyclohexyl-1,1-dimethyhydrazine, 1-tert-butyl-1,2,2-trimethylhydrazine, 1,2-diethylhydrazine, 1-(1-phenylethyl)hydrazine, 1-(2-methylphenyl)hydrazine, 1,2-bis(4-methylphenyl)hydrazine, 1,2-bis(trityl)hydrazine, 1-(1-methyl-2-phenylethyl)hydrazine, 1-Isopropylhydrazine, 1,2-Dimethylhydrazine, N,N-Dimethylhydrazine, 1-Boc-1-methylhydrazine, Tetramethylhydrazine, Ethylhydrazine, 2-Benzylidene-1,1-dimethylhydrazine, 1-Benzyl-2-methylhydrazine, 2-Hydrazinopyrazine), primary or secondary amines (i.e., $H_xNR_3$-x, wherein each R is independently a $C_1$-$C_4$ hydrocarbon and x is at 1 or 2) (e.g., $NMeH_2$, $NEtH_2$, $NMe_2H$, $NEt_2H$, $(SiMe_3)_2NH$, n-Butylamine, Sec-Butylamine, Tert-Butylamine, Dibutylamine, Diisopropylamine, N,N-Diisopropylethylamine, N,N-dimethylethylamine, Dipropylamine, Ethylmethylamine, Hexylamine, Isobutylamine, Isopropylamine, Methylhexanamine, Pentylamine, Propylamine, cyclic amines like pyrrolidine or pyrimidine), ethylene diamines (i.e., $R_2N$—$C_2H_4$—$NR_2$ wherein each R is independently H, a C1-C4 hydrocarbon with the proviso that at least one R is H) (e.g., ethylene diamine, N,N'-dimethylethylene diamine, tetramethylethylene diamine), pyrazoline, pyridine, radicals thereof, or mixtures thereof. If the desired Si-containing film also contains oxygen, C-containing N source may include $H_2N$—$C_xH_{2x}$—OH, with x=1-4 hydrocarbon, such as ethanolamine. Preferably the reactant is $NH_3$, radicals thereof, or mixtures thereof.

In Step 7a, the substrate is subject to thermal curing at a temperature ranging from approximately 101° C. to approximately 1,000° C., preferably from approximately 200° C. to approximately 800° C., under an inert or reactive gas. A furnace or rapid thermal processor may be used to perform the thermal curing process. Exemplary furnaces include the ThermoFisher Lindberg/Blue M™ tube furnace, the Thermo Scientific Thermolyne™ benchtop tube furnace or muffle furnace, the Inseto tabletop quartz tube furnace, the NeyTech Vulcan benchtop furnace, the Tokyo Electron TELINDY™ thermal processing equipment, or the ASM International ADVANCE® vertical furnace. Exemplary rapid thermal processors include Solaris 100, ULVAC RTP-6, or Annealsys As-one 100.

Alternatively, in Step 7b, the substrate is subject to UV-curing at a wavelength ranging from approximately 190 nm to approximately 400 nm using a monochromatic or polychromatic source. Exemplary VUV- or UV-curing systems suitable to perform Step 8b include, but are not limited to, the Nordson Coolwaves 2 UV curing system, the Heraeus Noblelight Light Hammer® 10 product platform, or the Radium Xeradex® lamp.

In another alternative of Step 7c, both the thermal and UV process may be performed at the same temperature and wavelength criteria specified for Steps 7a and 7b. The thermal and UV curing may be performed simultaneously or sequentially. One of ordinary skill in the art will recognize that the choice of curing methods and conditions will be determined by the target silicon-containing film desired.

In another alternative, the thermal curing process may proceed in a stepwise fashion. More particularly, the thermal curing may start at a temperature ranging from approximately 50° C. to approximately 500° C. under an inert or reactive gas for a time period ranging from approximately 10 to approximately 30 minutes. The temperature may be increased by approximately 50° C. to approximately 150° C. and maintained for an additional 10 to 30 minutes. Additional incremental temperature increases may be used, if necessary. Alternatively, the temperature may be increased using a specified ramp and then maintained at specific temperatures for a short period of time. For example, the wafer may be placed in a room temperature chamber being heated at a ramping rate of approximately 1° C./minute to approximately 100° C./minute, preferably from approximately 5° C./minute to approximately 40° C./minute, and more preferably from approximately 10° C./minute to approximately 20° C./minute. Once the temperature reaches the desired heating temperature, for example approximately 10° C. to approximately 400° C., the ramping may be stopped for a specified period of time, for example ranging from approximately 5 minutes to approximately 120 minutes. The same or a different ramping temperature rate may then be used to increase the chamber temperature to the next desired heating temperature, for example approximately 300° C. to approximately 600° C. and be maintained for another specified period of time, for example ranging from approximately 5 minutes to approximately 120 minutes. This may be repeated for again if a third heating temperature is desired, for example approximately 500° C. to approximately 1,000° C. and maintained for another specified period of time, for example ranging from approximately 5 minutes to approximately 300 minutes. In yet another alternative, the curing may use a slow, steady heating ramp without any specified time spent at any specific temperature (e.g., approximately 0.5° C./minute to approximately 3° C./minute). Once curing is complete, the furnace is allowed to cool to room temperature at a cooling rate ranging from approximately 1° C./minute to approximately 100° C./minute. Applicants believe that any of these thermal curing steps may help to reduce formation of cracks and voids in the resulting film.

Additionally, shrinkage may be further reduced by controlling the $O_2:H_2O$ ratio when an oxygen-containing atmosphere is required. Preferably, the $O_2:H_2O$ ratio ranges from approximately 6:1 to approximately 2.5:1. Alternatively, shrinkage may be reduced using an $H_2O_2:H_2O$ atmosphere. The shrinkage may be calculated as: 100% X [1−(hardbake film thickness)/(prebaked film thickness)]. The disclosed PHPS compositions may provide oxide shrinkage ranging from approximately −5% to approximately 15%, preferably from approximately 0% to approximately 10%, and more preferably from approximately 0% to approximately 5%. After curing, the resulting SiO2 film has a O:Si ratio ranging from approximately 1.8:1 to approximately 2.1:1. The C content of the resulting SiO2 film ranges from approximately 0 atomic % to approximately 7 atomic %, preferably from approximately 0 atomic % to approximately 5 atomic %. The Si, O, and C concentrations may be determined by X-ray photoelectron spectroscopy (XPS). The wet etch rate ratio of the cured SiO2 film using a 1% HF-water solution ranges from approximately 1:1 to approximately 5:1 as compared to thermal oxide grown at 1100° C.

In Step 8, the cured film is characterized using standard analytic tools. Exemplary tools include, but are not limited to, ellipsometers, x-ray photoelectron spectroscopy, atomic force microscopy, x-ray fluorescence, fourier-transform infrared spectroscopy, scanning electron microscopy, secondary ion mass spectrometry (SIMS), Rutherford backscattering spectrometry (RBS), profilometer for stress analysis, or combination thereof.

The silicon-containing films resulting from the processes discussed above may include $SiO_2$; SiN; SiON; SiOC; SiONC; SiCN; SiMCO, in which M is selected from Zr, Hf, Ti, Nb, V, Ta, Al, Ge, B, Nb. One of ordinary skill in the art will recognize that by judicial selection of the appropriate PHPS composition and co-reactants, the desired film composition may be obtained.

Spin-on deposition using the disclosed PHPS compositions also was capable of producing silicon oxide films having a refractive index of approximately 1.45. The wet etch rate for films hardbaked at 800° C. was 90 A/min as compared to 60 A/min for thermal oxide hardbaked at 1100° C. The silicon oxide films also exhibited excellent gap-fill in a trench having an aspect ratio of 9:1.

Figure 3:
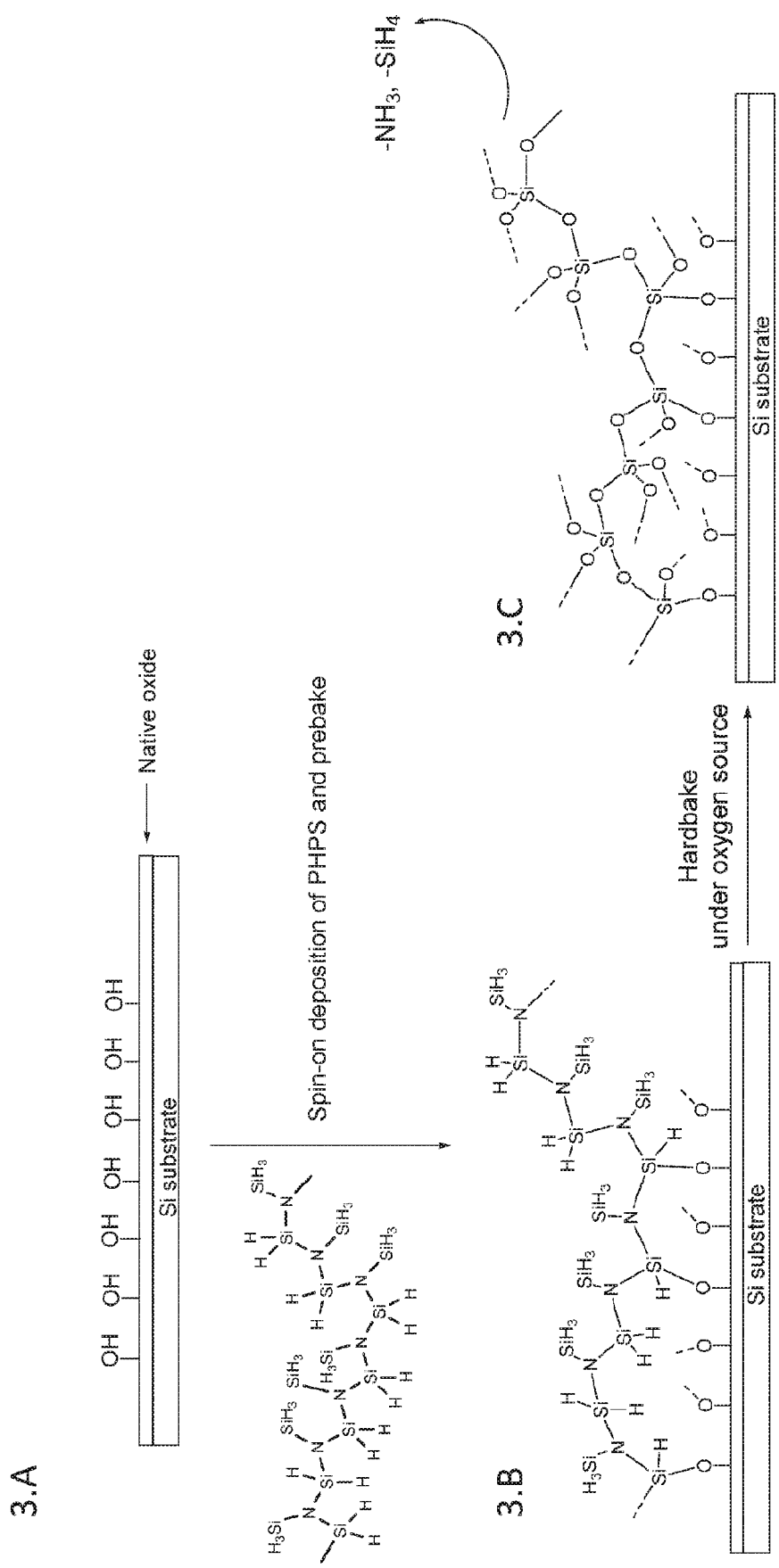
FIG. 3 is a schematic of the reaction process for silicon oxide deposited on a partially hydrogenated silicon surface.

FIG. 3 is a schematic of the reaction process for silicon oxide deposited on a partially hydrogenated silicon surface. FIG. 3A shows the partially hydrogenated silicon surface on which the silicon oxide will be deposited. FIG. 3B shows the surface after the N—H free, C-free, and Si-rich PHPS of the Si-containing film forming composition is deposited on the surface and undergoes pre-bake and/or initial curing. FIG. 3C shows the Silicon oxide film formed after the completion of the curing process. Currently, it is not clear to Applicant at which temperatures the polymer becomes covalently bonded to the surface.

Figure 4:
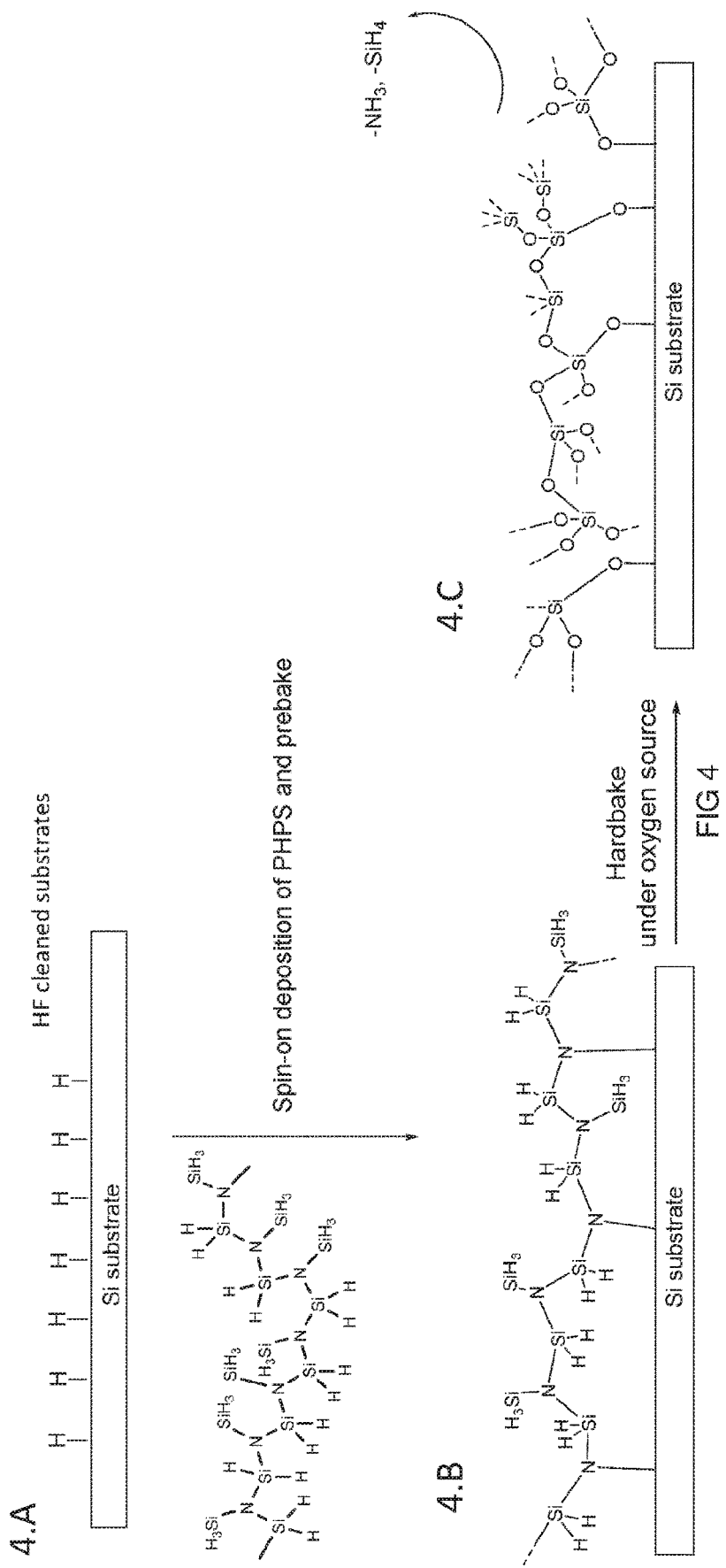
FIG. 4 is a schematic of the reaction process for silicon oxide deposited on a non-hydrogenated silicon surface.

FIG. 4 is a schematic of the reaction process for silicon oxide deposited on a non-hydrogenated silicon surface. As described above, the substrate may be cleaned with HF and produce the non-hydrogenated surface of FIG. 4A. FIG. 4B shows the surface after the N—H free, C-free, and Si-rich PHPS of the Si-containing film forming composition is deposited on the surface and undergoes pre-bake and/or initial curing. FIG. 4C shows the Silicon oxide film formed after the completion of the curing process. Again, it is not clear to Applicant at which temperatures the polymer becomes covalently bonded to the surface.

Figure 5:
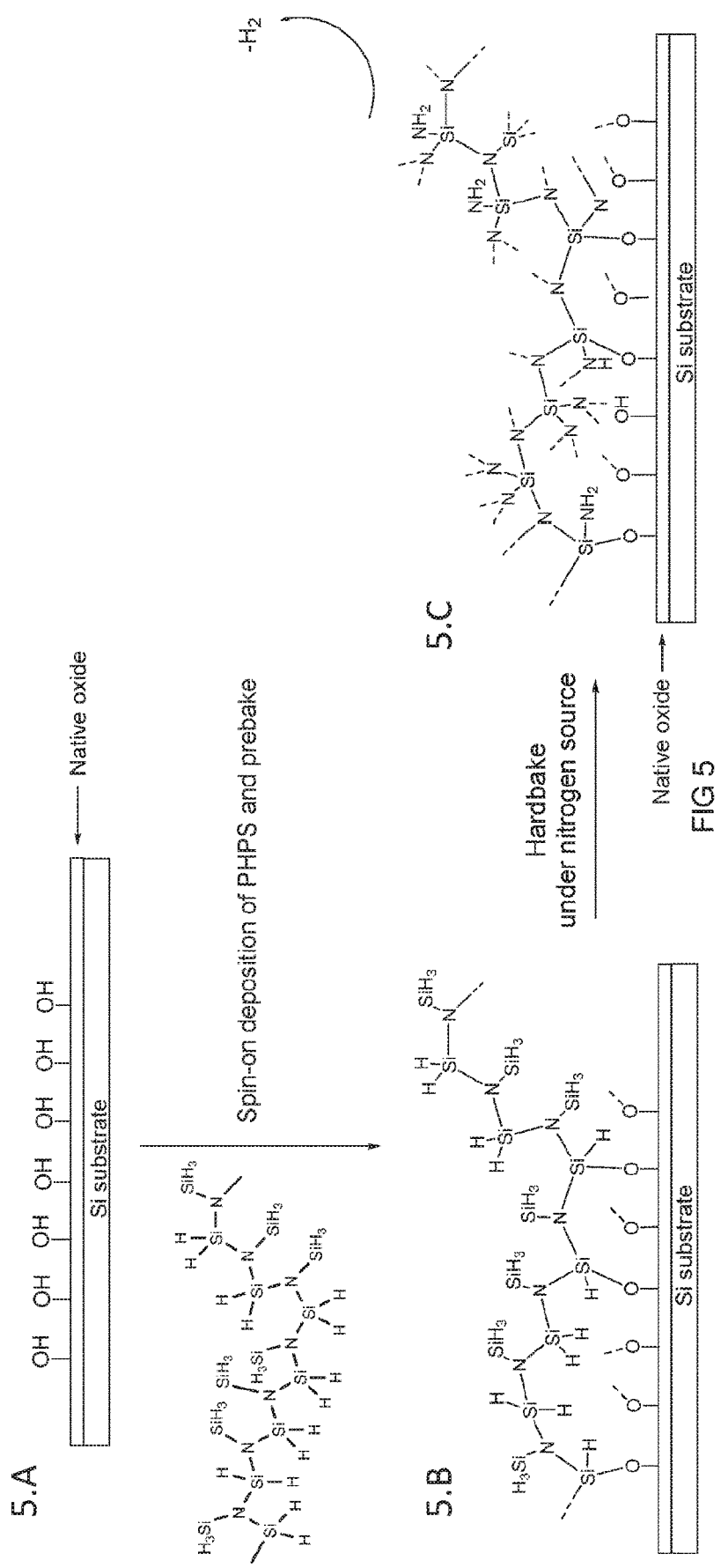
FIG. 5 is a schematic of the reaction process for silicon nitride deposited on a partially hydrogenated silicon surface.

FIG. 5 is a schematic of the reaction process for silicon nitride deposited on a partially hydrogenated silicon surface. FIG. 5A shows the partially hydrogenated silicon surface on which the silicon oxide will be deposited. FIG. 5B shows the surface after the N—H free, C-free, and Si-rich PHPS of the Si-containing film forming composition is deposited on the surface and undergoes pre-bake and/or initial curing. FIG. 5C shows the Silicon nitride film formed after the completion of the curing process. Currently, it is not clear to Applicant at which temperatures the polymer becomes covalently bonded to the surface.

Figure 6:
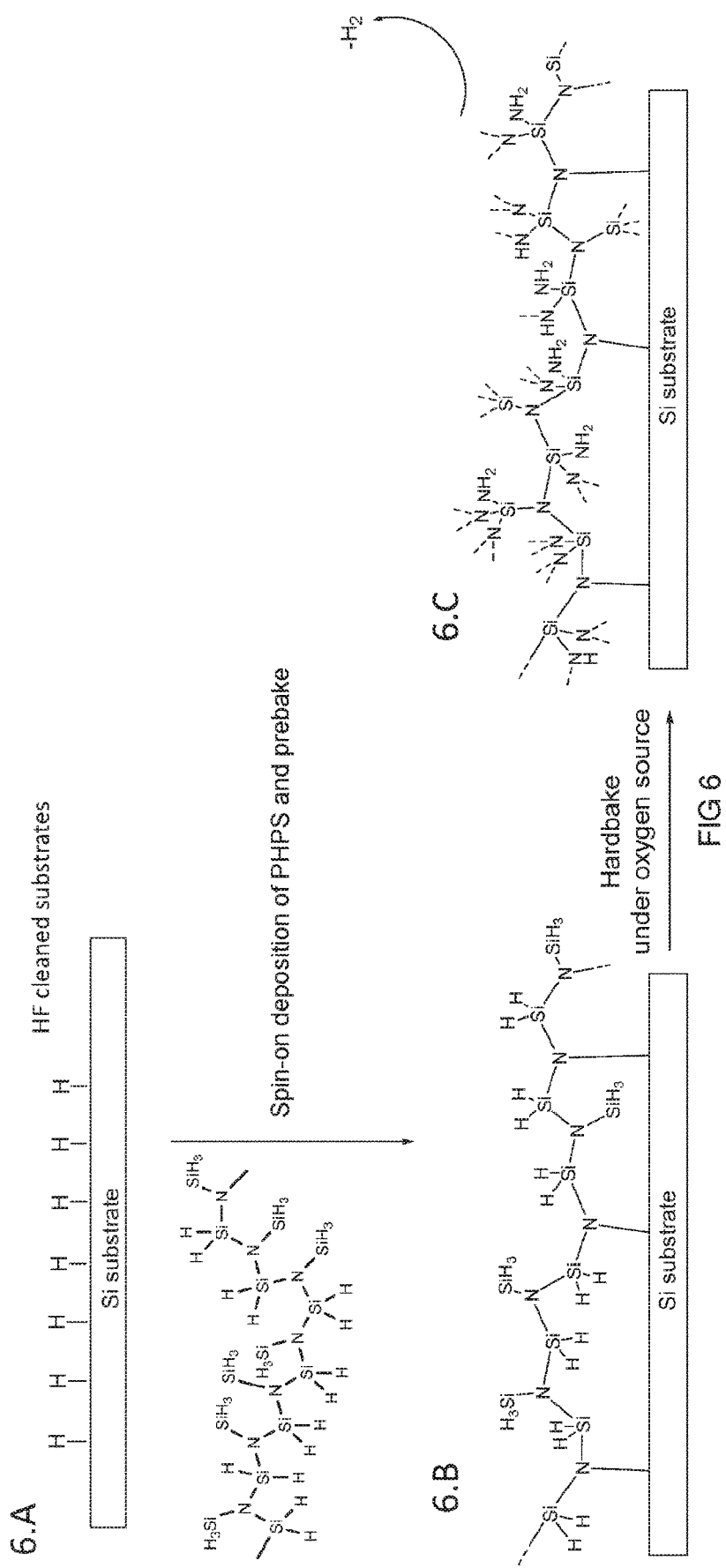
FIG. 6 is a schematic of the reaction process for silicon nitride deposited on a non-hydrogenated silicon surface.

FIG. 6 is a schematic of the reaction process for silicon nitride deposited on a non-hydrogenated silicon surface. As described above, the substrate may be cleaned with HF and produce the non-hydrogenated surface of FIG. 6A. FIG. 6B shows the surface after the N—H free, C-free, and Si-rich PHPS of the Si-containing film forming composition is deposited on the surface and undergoes pre-bake and/or initial curing. FIG. 6C shows the Silicon nitride film formed after the completion of the curing process. Again, it is not clear to Applicant at which temperatures the polymer becomes covalently bonded to the surface.

Currently, the primary method for shrinkage control is to increase the polymer crosslinking in synthesis by optimizing reaction conditions, including reaction temperature/pressure/time, catalyst activity, precursor concentration, and so on. However, it is difficult to fully optimize all of these inter-dependent conditions. For instance, US 2016/0379817 to Okamura still had 12-15% shrinkage with a variety of PHPS polymers synthesized at different conditions.

The disclosed Si-containing film forming compositions provide less shrinkage of Si-containing films than prior art NH-containing PHPS compositions for applications in shallow trench isolation dielectrics, pre-metal dielectrics, and inter-layer dielectrics in semiconductor electronic devices. Applicants believe that the oxide film produced from the disclosed Si-containing film forming compositions will have approximately 95-100% stoichiometric uniformity between the bottom and top of any features and preferably 98-100% as determined by X-ray Photoelectron Spectroscopy (XPS) or Energy Dispersive X-ray (EDX) spectroscopy. Applicants further believe that the resulting oxide films will have a thin film stress measurement ranging from approximately −160 MPa to approximately +160 MPa as determined by profilometer.

The recipe for the curing of the film and conversion to SiO2 is also widely investigated to decrease the shrinkage, as it is believed that the shrinkage is related to the loss (volatilization) of short oligomers before they are oxidized during the curing step. As such, there is a competition between oxidation during curing and evaporation of short chain silicon containing oligomers, and the curing recipe (composition of the vapor phase, temperature ramp speed, etc.) have a significant impact on the final film shrinkage.

Overall, both parameters combine to yield the final shrinkage.

EXAMPLES

The following non-limiting examples are provided to further illustrate embodiments of the invention. However, the examples are not intended to be all inclusive and are not intended to limit the scope of the inventions described herein.

Pre-Example 1: Synthesis of the N—H Free, C-Free, and Si-Rich PHPS

TSA (30 g, 0.28 mol) was added to a suspension of Pentane (266 mL) and catalyst $B(C_6F_5)_3$ (1.2 mmol, 0.7 g). The reaction mixture was allowed to stir for 1.5 hours at room temperature. The reactor was then cooled to −78° C. by using a dry-ice/IPA bath and volatiles (mainly silane) were cryotrapped into a stainless steel lecture bottle at −196° C. The reactor was then opened under an inert atmosphere and 2 mL TEA added to the clear solution to quench the reaction. The resulting cloudy mixture was filtered over a filter paper to obtain a white solid (0.25 g). The colorless clear pentane solution was then subjected to distillation. After removing volatiles, a clear, colorless viscous oil was obtained (18.5 g). The solid was analyzed by FTIR to confirm that the solid is the adduct of the catalyst and inhibitor. The oil PHPS reaction product was subjected to GC, GPC, FTIR and TGA analysis.

Figure 7:
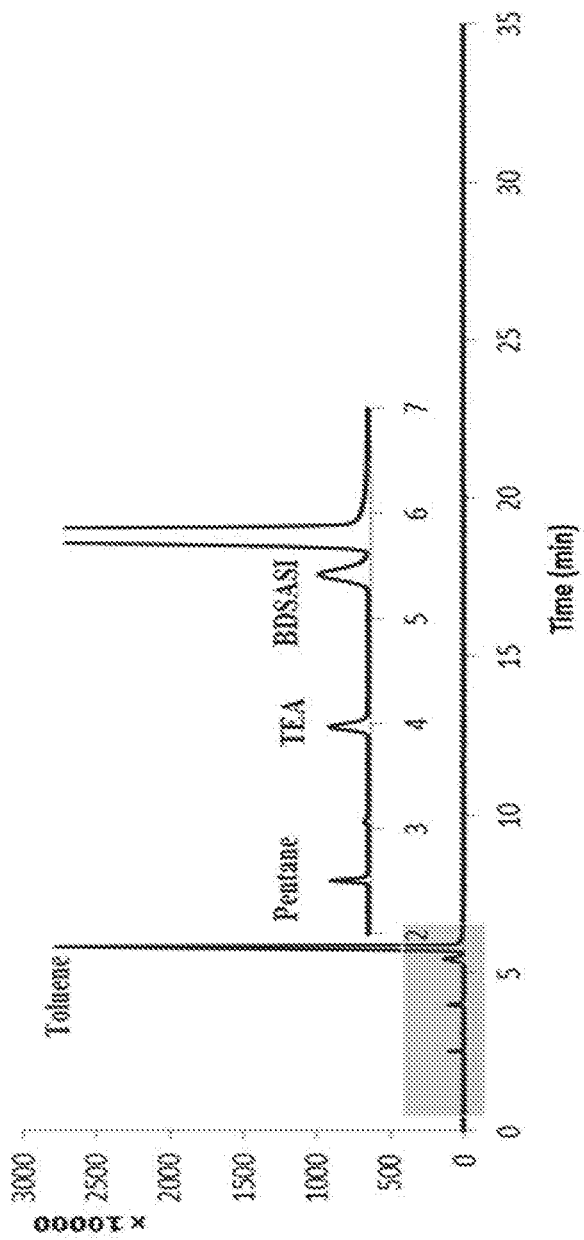
FIG. 7 is a GC spectrum of the N—H free, C-free, and Si-rich perhydropolysilazane oil of Pre-Example 1 diluted in toluene.

FIG. 7 is a GC spectrum of the oil diluted in toluene. Traces of pentane, triethylamine (TEA), and bis(disilylamino)silane (BDSASI) were observed (inset).

Figure 8:
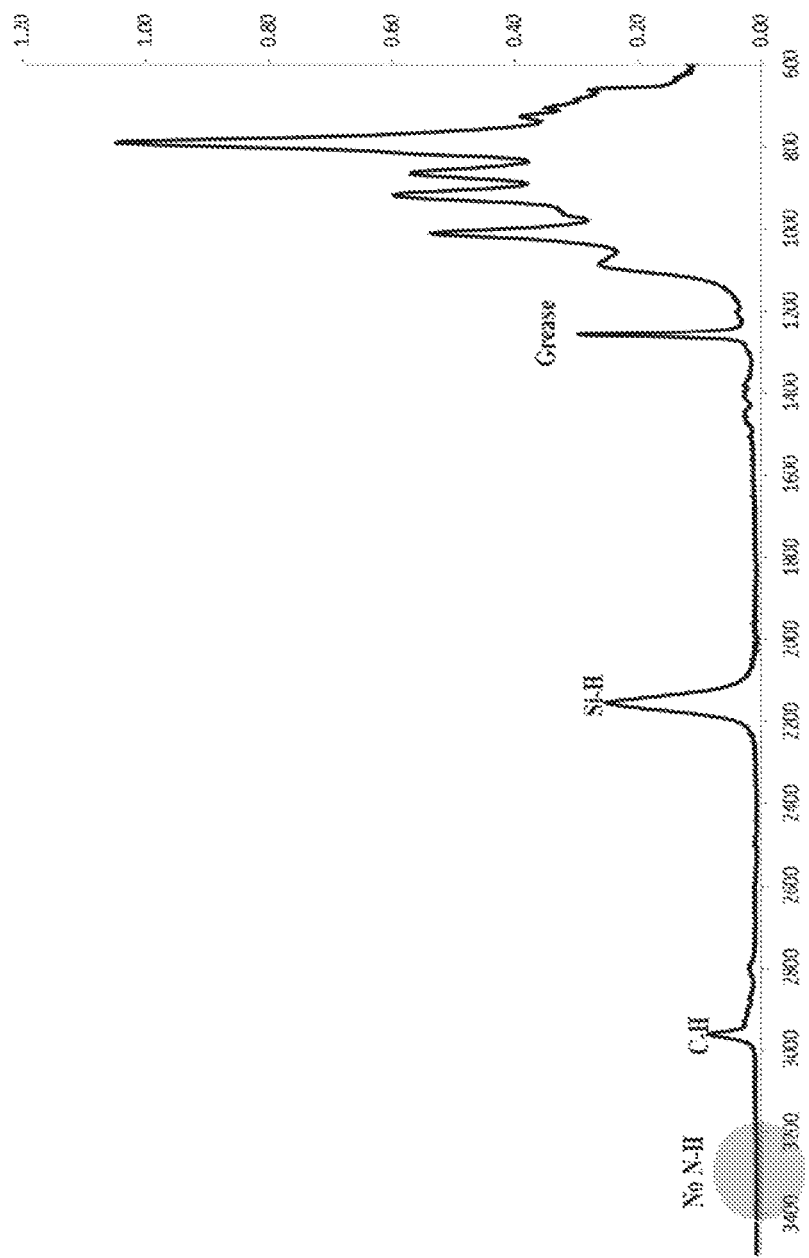
FIG. 8 is a FTIR spectrum of the N—H free, C-free, and Si-rich perhydropolysilazane oil of Pre-Example 1 after volatiles were removed.

FIG. 8 is a FTIR spectrum of the oil after volatiles were removed. A sharp peak at 1350 cm$^{-1}$ was assigned to the silicon grease. Traces of pentane resulted in C—H stretch at ~2900 cm$^{-1}$ The calculated $SiH_2:SiH_3$ ratio was 1.8, indicating more $SiH_2$ than $SiH_3$. As expected, the additional reaction time of this example as compared to Examples 8 and 9 results in more cross-linking in the PHPS reaction product.

The Si:N ratio is calculated to be 1.97 based on $M_n$.

The GPC results indicate a $M_n$ of 2150 and a $M_w$ of 6390. The resulting 3.0 polydispersity index (PDI) demonstrates a broad oligomer size distribution.

Pre-Example 2: Air Stability of PHPS Formulations 5 mL of 10 wt % PHPS formulation in toluene (N—H free) was loaded into a dropping funnel in a nitrogen filled glove box. The 10 wt % PHPS formulation used a PHPS product that was synthesized using inverse addition of 30 g of TSA and 0.25 mol. % of the $B(C_6F_5)$ catalyst in toluene for a total reaction time of 1 hour and 5 minutes. The PHPS product had a $M_w$ of 50,000, a $M_n$ of 7200, and a GPC of 6.9. The funnel was sealed and transferred to the fume hood for air stability test. The PHPS formulation in the funnel was slowly added into a petri dish. Any change in the appearance of the formulation was observed for 30 minutes and recorded by a video camera.

For comparison, 5 mL of a commercially available NH-containing PHPS formulation was prepared and tested under the same conditions. Both formulations were clear (i.e., transparent) before being added to the petri dish.

After 30 minutes of direct exposure to ambient air in the fume hood, the N—H free PHPS formulation remained clear and transparent. Over time, the formulation became viscous and eventually transformed into a clear solid due to solvent evaporation.

In sharp contrast, the commercially available N—H containing PHPS formulation turned cloudy white within 5 minutes of air exposure, and eventually turned into a white solid after 30 minutes. This difference indicates that the NH-free PHPS formulation is more air-stable than the counterpart with NH groups.

Example 1: Oxide Film Formation Using PHPS with Zr-Containing Crosslinking Catalysts and High-Temperature Hardbaking 2 wt % of Tris(dimethylamino)cyclopentadienyl Zirconium catalyst $[(C_6H_5)Zr[N(CH_3)_2]_3]$ was added into a 7 wt % NH-free PHPS formulation in toluene. The wt % of the catalyst was calculated as: 100%×(weight of catalyst)/(weight of PHPS polymer in toluene).

The NH-free PHPS was synthesized similarly to the synthesis performed in Pre-Example 1, except toluene was used as a solvent, half the amount of catalyst and TEA quenching agent was used, and the reaction mixture was allowed to stir for 2 hours at room temperature. The resulting NH-free PHPS polymer oil had a $M_w$ of 870,000 and a $M_n$ of 24,840.

After adding catalyst, 0.1-0.2 mL of the PHPS formulation was spin coated onto a 1" square Si wafer at 1500 rpm for 1 minute in a $N_2$ filled glove box. The PHPS film formed on the Si wafer was prebaked on a hot plate at 150° C. for 3 minutes in the glove box. The wafer was removed from the glove box, and the film thickness was measured using an ellipsometer.

The wafer was loaded into a tube furnace and was hardbaked at 800° C. for 1 hour under atmospheric pressure with 20% steam, 16% $O_2$, and 64% $N_2$. After hardbaking (Film #1 in Table 1), the silicon oxide film thickness was measured again to obtain the hardbaked film thickness, and the shrinkage was calculated as: 100%×[1−(hardbake film thickness)/(prebaked film thickness)].

This process was repeated 7 and 14 days after mixing the same PHPS formulation with the catalyst. The film shrinkage and other parameters are listed in the Table 1.

Figure 9:
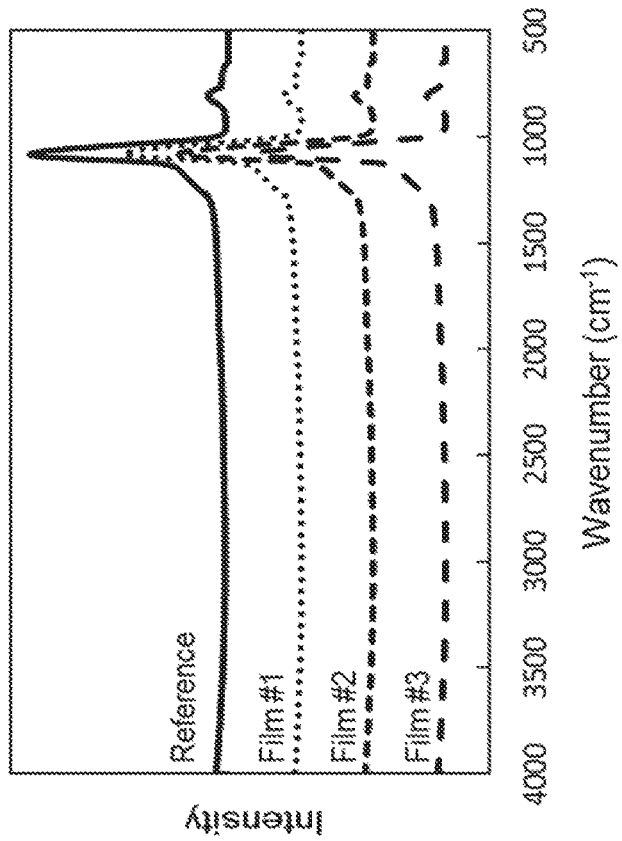
FIG. 9 is a comparative Fourier Transform InfraRed (FTIR) spectrum of the 4 silicon oxide films of Example 1.

Fourier Transform InfraRed (FTIR) spectra of the films was obtained. FIG. 9 is a comparative FTIR spectrum of the 4 films, showing no NH peak at approximately the 3200-3500 wavenumber.

All three films coated from the catalyst-doped formulation show reduced shrinkage after hardbaking as compared to the reference film coated from the same PHPS formulation without any catalyst. In addition, the shrinkage decreases as the formulation ages, which suggests that the catalyzed crosslinking between polymer chains is a time-dependent reaction. Table 1 also demonstrates that the shrinkage stops decreasing between Day 7(13.0%) and Day 14 (12.9%).

TABLE 1

| Film | Dopant | Age (Days) | Thickness-Hardbaked (nm) | Shrinkage (%) | RI[1] | WER[2] | O:Si (XPS) |
|---|---|---|---|---|---|---|---|
| Reference | None | | 424 | 17.0 | 1.45 | 1.2 | 1.9 |
| #1 | Zr[3] | 0 | 432 | 15.8 | 1.45 | 1.7 | 1.9 |
| #2 | Zr[3] | 7 | 447 | 13.0 | 1.46 | 1.6 | 1.9 |
| #3 | Zr[3] | 14 | 449 | 12.9 | 1.45 | 1.4 | 1.9 |

[1]RI = Refractive Index
[2]WER = Wet Etch Rate calculated from the thickness measured prior and after etching in 1% HF solution
[3]Zr = Zr($C_5H_5$)($NMe_2$)$_3$ Both the FTIR spectra (FIG. 9) and XPS data (Table 1) show that Films #1-#3 are C and N free, and they have a chemical composition of $SiO_{1.9}$, which is very close to stoichiometric $SiO_2$.

Example 2: Oxide Film Formation Using PHPS with Ti-Containing Crosslinking Catalysts and High-Temperature Hardbaking 0.5 mol % of Tetrakis(diethylamino)Titanium (Ti[$NEt_2$]$_4$) catalyst was added into the same 7 wt % NH-free PHPS formulation in toluene of Example 1. The same process as Example 1 was performed for this catalyst-doped formulation, and the results are listed in Table 2. The data show that, similar to ($C_5H_5$)Zr[N($CH_3$)$_2$]$_3$, Ti[$NE_2$]$_4$ can promote the inter-chain crosslinking for PHPS, and reduce its film shrinkage as well.

TABLE 2

| Film | Dopant | Age (Days) | Thickness-Hardbaked (nm) | Shrinkage (%) | RI[1] | WER[2] | O:Si (XPS) |
|---|---|---|---|---|---|---|---|
| Reference | None | | 424 | 17.0 | 1.45 | 1.2 | 1.9 |
| #4 | Ti[3] | 0 | 434 | 14.0 | 1.45 | 1.8 | 1.9 |
| #5 | Ti[3] | 7 | 453 | 12.9 | 1.47 | 1.1 | 1.9 |
| #6 | Ti[3] | 14 | 453 | 12.9 | 1.47 | 1.3 | 1.9 |

Figure 10:
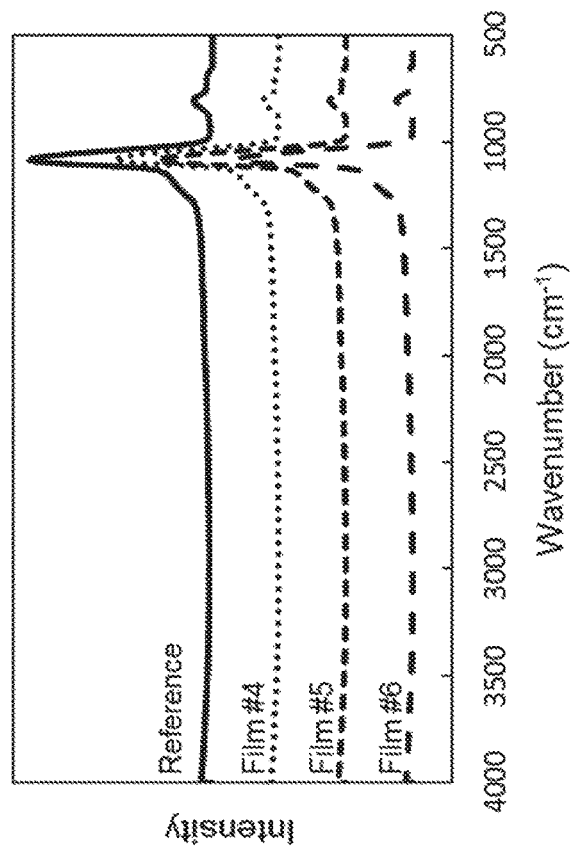
FIG. 10 is a comparative Fourier Transform InfraRed (FTIR) spectrum of the 4 silicon oxide films of Example 2.

[1]RI = Refractive Index
[2]WER = Wet Etch Rate calculated as in Example 1
[3]Ti = Ti($NEt_2$)$_4$ Fourier Transform InfraRed (FTIR) spectra of the films was also obtained. FIG. 10 is a comparative FTIR spectrum of the 4 films, showing no NH peak at approximately the 3200-3500 wavenumber.

Both FTIR (FIG. 10) and XPS data (Table 2) show that Films #4-46 are C and N free, and they have a chemical composition of $SiO1.9$, which is very close to stoichiometric $SiO_2$.

Example 3: Oxide Film Formation Using PHPS with Crosslinking Catalysts and Low-Temperature Hardbaking 2 wt % Tris(dimethylamino)cyclopentadienyl Zirconium catalyst [($C_5H_5$)Zr[N($CH_3$)$_2$]$_3$] was added into the same 7 wt % NH-free PHPS formulation in toluene of Example 1. The PHPS polymer has a $M_w$ of 870,000. The wt % of the catalyst was calculated as: 100%×(weight of catalyst)/ (weight of PHPS polymer in toluene).

0.1-0.2 mL of the PHPS formulation was spin coated onto a 1″ square Si wafer at 1500 rpm for 1 minute in a $N_2$ filled glove box. The PHPS film formed (Day 0) on the Si wafer was prebaked on a hot plate at 150° C. for 3 minutes in the glove box. The prebaked film was removed from the glove box and the film thickness was measured by using an ellipsometer.

The prebaked film was loaded into a tube furnace and was hardbaked at 400° C. for 3 hours under atmospheric pressure with 10% hydrogen peroxide, 33% steam, and 57% $N_2$. After hardbaking, the film thickness was measured again to obtain the hardbaked film thickness, and the shrinkage was calculated as: 100%×[1−(hardbake film thickness)/(prebaked film thickness)]. The results are listed in Table 3.

2 wt % Tetrakis(diethylamino)Titanium catalyst (Ti [$NEt_2$]$_4$) was added into the same 7 wt % NH-free PHPS formulation in toluene of Example 1. The same process and hardbaking conditions as above were performed for this catalyst-doped formulation, and the results were listed in Table 3.

2 wt % Cobalt carbonyl catalyst ($Co_2(CO)_8$) was added into the same 7 wt % NH-free PHPS formulation in toluene of Example 1. The same process and hardbaking conditions as above were performed for this catalyst-doped formulation, and the results were listed in Table 3.

Figure 11:
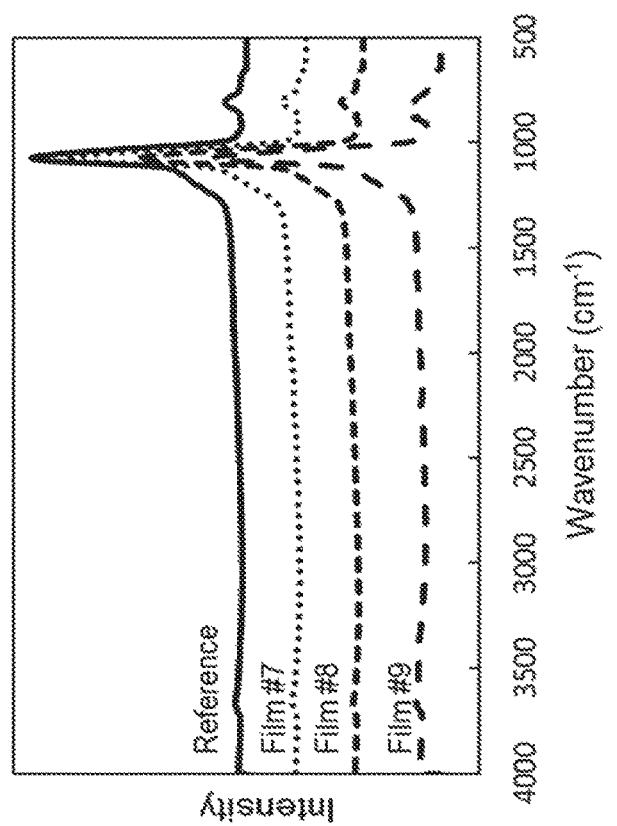
FIG. 11 is a comparative FTIR spectrum of the 4 silicon oxide films in Example 3.

FTIR spectra of the films was obtained. FIG. 11 is a comparative FTIR spectrum of the 4 films, showing no NH peak at the 3200-3500 wavenumber.

Table 3 shows that a shrinkage that is less than 10% is achieved by using a low-temperature hardbaking method for the reference PHPS-only film without any catalyst. More importantly, all 3 catalyst-containing formulations show reduced film shrinkage, in particular for the one with $Co_2(CO)_8$. These results suggest that a very low shrinkage can be achieved if a catalyst-containing PHPS formulation is coated, and hardbaked by using a lower-temperature curing method.

TABLE 3

| Film | Dopant | Thickness-Hardbaked (nm) | Shrinkage (%) | RI[1] | WER[2] | O:Si (XPS) |
|---|---|---|---|---|---|---|
| Reference | None | 455 | 9.6 | 1.46 | 2.5 | 1.9 |
| #7 | Zr[3] | 493 | 8.2 | 1.45 | 2.3 | 1.9 |
| #8 | Ti[4] | 498 | 8.0 | 1.45 | 2.3 | 1.9 |
| #9 | Co[5] | 504 | 4.5 | 1.45 | 2.3 | 1.9 |

[1]RI = Refractive Index
[2]WER = Wet Etch Rate calculated as in Example 1
[3]Zr = Zr($C_5H_5$)($NMe_2$)$_3$
[4]Ti = Ti($NEt_2$)$_4$
[5]Co = $Co_2(CO)_8$ Both FTIR (FIG. 7) and XPS data (Table 3) show that Films #7-#9 are C and N free, and they have a chemical composition of $SiO_{1.9}$, which is very close to stoichiometric $SiO_2$.

Example 4: Oxide Film Formation Using PHPS with Polysilane and High-Temperature Hardbaking 7 wt % polysilane formulation in toluene was blended with the same 7 wt % NH-free PHPS formulation in toluene of Example 1 at a volume ratio of 1:1. The Polysilane has a $M_w$ of 2500. After blending, 0.1-0.2 mL of the mixed formulation was spin coated onto a 1" square Si wafer at 1500 rpm for 1 minute in a $N_2$ filled glove box, and the films were processed in the same way as described in Example 1. Three different hardbaking temperatures were used to compare the shrinkage of films from the PHPS-only formulations and the blended formulations with Polysilane. The film performance, listed in Table 4, shows that adding Polysilanes reduces film shrinkage by up to 3.2%. XPS data show that these films are C and N free, and they have a chemical composition of $SiO_{1.9-2.0}$, which is stoichiometric.

TABLE 4

| Formulation | Hardbake Temp. (° C.) | Film Thickness (nm) | Shrinkage (%) | RI[1] | WER[2] | O:Si (XPS) |
|---|---|---|---|---|---|---|
| PHPS | 600 | 422 | 15.6 | 1.45 | 2.9 | 1.8 |
|  | 700 | 400 | 18.8 | 1.48 | 1.6 | 1.9 |
|  | 800 | 403 | 19.6 | 1.47 | 1.1 | 1.9 |
| PHPS + | 600 | 220 | 14.9 | 1.45 | 2.4 | 1.9 |
| Polysilane | 700 | 213 | 15.5 | 1.45 | 1.9 | 2.0 |
|  | 800 | 220 | 16.4 | 1.46 | 1.3 | 2.9 |

[1]RI = Refractive Index
[2]WER = Wet Etch Rate calculated as in Example 1

Example 5: Oxide Film Formation Using PHPS with Polysilane and Low-Temperature Hardbaking 7 wt % polysilane formulation in toluene was blended with the same 7 wt % NH-free PHPS formulation in toluene of Example 1 at a volume ratio of 1:1. The Polysilane has a $M_w$ of 2500. After blending, 0.1-0.2 mL of the mixed formulation was spin coated onto a 1" square Si wafer at 1500 rpm for 1 minute in a $N_2$ filled glove box. The resulting films were processed in the same way as described in Example 4. The film performance, listed in Table 5, shows that adding Polysilanes can reduce film shrinkage by ~2%. XPS data show that these films are C and N free, and they have a chemical composition of $SiO_2$, which is nearly stoichiometric.

TABLE 5

| Formulation | Thickness-Hardbaked (nm) | Shrinkage (%) | RI[1] | WER[2] | O:Si (XPS) |
|---|---|---|---|---|---|
| PHPS | 455 | 9.6 | 1.46 | 2.5 | 1.9 |
| PHPS + Polysilane | 241 | 7.5 | 1.44 | 2.6 | 2.0 |

[1]RI = Refractive Index
[2]WER = Wet Etch Rate calculated as in Example 1

Example 6: PHPS with Catalyst and Polysilane and Low-Temperature Hardbaking

A 1/1 w/w PHPS/Polysilane formulation was prepared by mixing 10 wt % Polysilane formulation in diisopropylamine with the 7 wt % NH-free PHPS formulation in toluene of Example 1. The Polysilane has a $M_w$ of 554 with a $M_n$ of 509. 2 wt % of $Co_2(CO)_8$ catalyst was added into this PHPS/Polysilane formulation. Then the PHPS/Polysilane/$Co_2(CO)_8$ formulation was filtered through a 200 nm PTFE syringe filter. 0.1-0.2 mL of this formulation was spin coated onto a 1" square Si wafer at 1500 rpm for 1 minute in a $N_2$ filled glove box. The deposited film on the Si wafer was prebaked on a hot plate at 150° C. for 3 minutes in the glove box. The prebaked film was removed from the glove box and the film thickness was measured by using an ellipsometer. The prebaked film was loaded into a tube furnace and was hardbaked at 400° C. for 3 hours under atmospheric pressure with 10% hydrogen peroxide, 33% steam, and 57% N2. After hardbaking, the film thickness was measured again to obtain the hardbaked film thickness, and the shrinkage was calculated as: 100%×[1−(hardbake film thickness)/(prebaked film thickness)]. The results are listed in Table 6.

TABLE 6

| Formulation | Thickness-Hardbaked (nm) | Shrinkage (%) | RI[1] | WER[2] | O:Si (XPS) |
|---|---|---|---|---|---|
| PHPS + Polysilane + $CO_2(CO)_8$ | 331 | 7.0 | 1.47 | 2.7 | TBD |

Example 7: Catalyst Stability in PHPS Formulation

The catalyst's stability in the PHPS formulations is important because the polymer crosslinking reaction takes time to occur. Thus it is important to ensure that no particle-yielding reactions occur between the catalyst and PHPS polymer, or that the catalyst induces gelling of the formulation.

2 wt % of Tris(dimethylamino)cyclopentadienyl Zirconium catalyst $((C_5H_5)Zr[N(CH_3)_2]_3)$ was added into 5 mL of the same 7 wt % NH-free PHPS formulation in toluene of Example 1. As a comparison, 0.5 mol % catalyst was added into a 5 mL 10 wt % commercial NH-containing PHPS formulation in heptane. The optical clarity of these two catalyst-containing formulations was monitored by eyes and also a digital camera.

Figure 12:
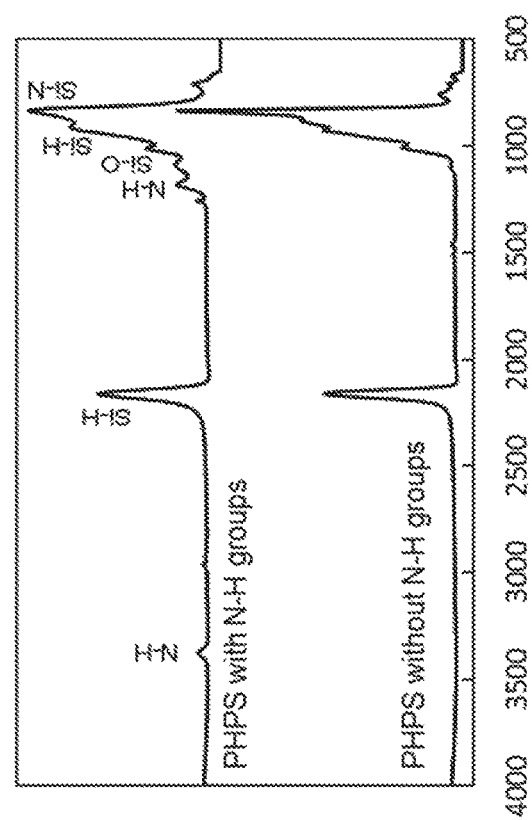
FIG. 12 is a comparative FTIR spectrum of the compositions in Example 7.

The FTIR spectra for NH-containing and NH-free PHPS film (prebaked) are shown in FIG. 12. These results show that the catalyst is compatible with the NH-free PHPS, while it reacts with NH-containing PHPS and immediately produces a yellow precipitate. These results confirm that the NH-free PHPS offers better catalyst stability and compatibility than prior art NH-containing PHPS.

Additional catalyst testing of Tetrakis(dimethylamido) Titanium ($Ti[NEt_2]_4$), Cobalt carbonyl ($Co_2(CO)_8$), Tetrakis(trimethylsiloxy)Titanium ($Ti(O-TMS)_4$), Aluminum acetylacetonate ($Al(acac)_3$), and Tris(dimethylamido)Aluminum ($Al[NMe_2]_3$), have been tested to determine their stability. Table 7 provides their reactivity and stability in NH-free PHPS formulation and the NH-containing conventional PHPS formulation.

TABLE 7

|  |  | NH-free PHPS | NH-containing PHPS |
|---|---|---|---|
| 1 | (no additives) | Clear liquid | Clear liquid |
| 2 | $(C_5H_5)Zr[NMe_2]_3$ | Color change to brown, still optically clear | Immediate precipitation |

TABLE 7-continued

| | | NH-free PHPS | NH-containing PHPS |
|---|---|---|---|
| 3 | Ti[NEt$_2$]$_4$ | Color change to golden, still optically clear | Color change to dark green, precipitation within 5 minutes |
| 4 | Co$_2$(CO)$_8$ | Color change to amber, still optically clear | immediate precipitation |
| 5 | Ti(O—TMS)$_4$ | No obvious change | No obvious change |
| 6 | Al(acac)3 | No obvious change | No obvious change |
| 7 | Al[NMe$_2$]$_3$ | No obvious change | immediate precipitation |
| 8 | Polysilane | No obvious change | No obvious change |
| 9 | Polysilane & Co$_2$(CO)$_8$ | Color change to amber, slightly cloudy | Color change to brown, cloudy, precipitation within 5 minutes |

These results show that 1) the organometallic catalysts are compatible with the NH-free PHPS, while most of them react with NH-containing PHPS and immediately produces a precipitate; and 2) polysilanes are compatible with both NH-free and NH-containing PHPS. In fact, all of the amino-containing catalysts react with the N—H containing PHPS to form precipitates, rendering the composition unusable. Overall, the NH-free PHPS offers better additive stability and compatibility than prior art NH-containing PHPS.

Example 8: Polysilane Stability in PHPS Formulation

The reactivity of Polysilane with NH-free or NH-containing PHPS was tested by mixing 10 wt % Polysilane formulation in diisopropylamine with either the 7 wt % NH-free PHPS formulation in toluene of Example 1 or 10 wt % commercial NH-containing PHPS formulation in heptane. The final weight ratio between PHPS and Polysilane is 1/1. Any optical or phase change of the solution after mixing was monitored by eyes and also recorded by a digital camera. The observation made was listed in Table 7-Row 8.

In another embodiment, the reactivity of catalysts in a mixed PHPS/Polysilane formulation was tested. Co$_2$(CO)$_8$ catalyst was selected, because it helped produce the lowest shrinkage in Table 3 for NH-free PHPS. 2 wt % of Co$_2$(CO)$_8$ was added into a 2 mL NH-free PHPS/Polysilane formulation (1/1 by weight) in toluene/diisopropylamine. As a comparison, a similar test was performed by adding 2 wt % of Co$_2$(CO)$_8$ into a 2 mL NH-containing PHPS/Polysilane formulation (1/1 by weight) in heptane/diisopropylamine. The observation made was listed in Table 7-Row 9.

Example 9: Formation of SiN Film by Spin on and Thermal Annealing

The NH-free PHPS was synthesized similarly to the synthesis performed in Pre-Example 1, except toluene was used as a solvent, half the amount of catalyst and TEA quenching agent was used, and the reaction mixture was allowed to stir for 2 hours at room temperature. The resulting NH-free PHPS polymer oil had a $M_w$ of 870,000 and a $M_n$ of 24,840.

The NH-free PHPS polymer was dissolved in toluene (10 wt %). Subsequently, the solution was blended with a Co$_2$(CO)$_8$ or Ru$_3$(CO)$_{12}$ catalyst at 1 part per weight catalyst per 100 parts of perhydropolysilazane in toluene. The mixture was coated onto a silicon substrate using a spin coater at a spin rate of 1500 rpm. The resulting film was prebaked under N$_2$ at 150° C. for 3 min with a hot plate. The polymer on the silicon wafer was hardbaked in a conventional horizontal tube furnace in NH$_3$ at 7 torr for 90 minutes. The temperature of the furnace was ramped from room temperature to 600° C. at a 10° C./minute ramp rate.

Figure 13:
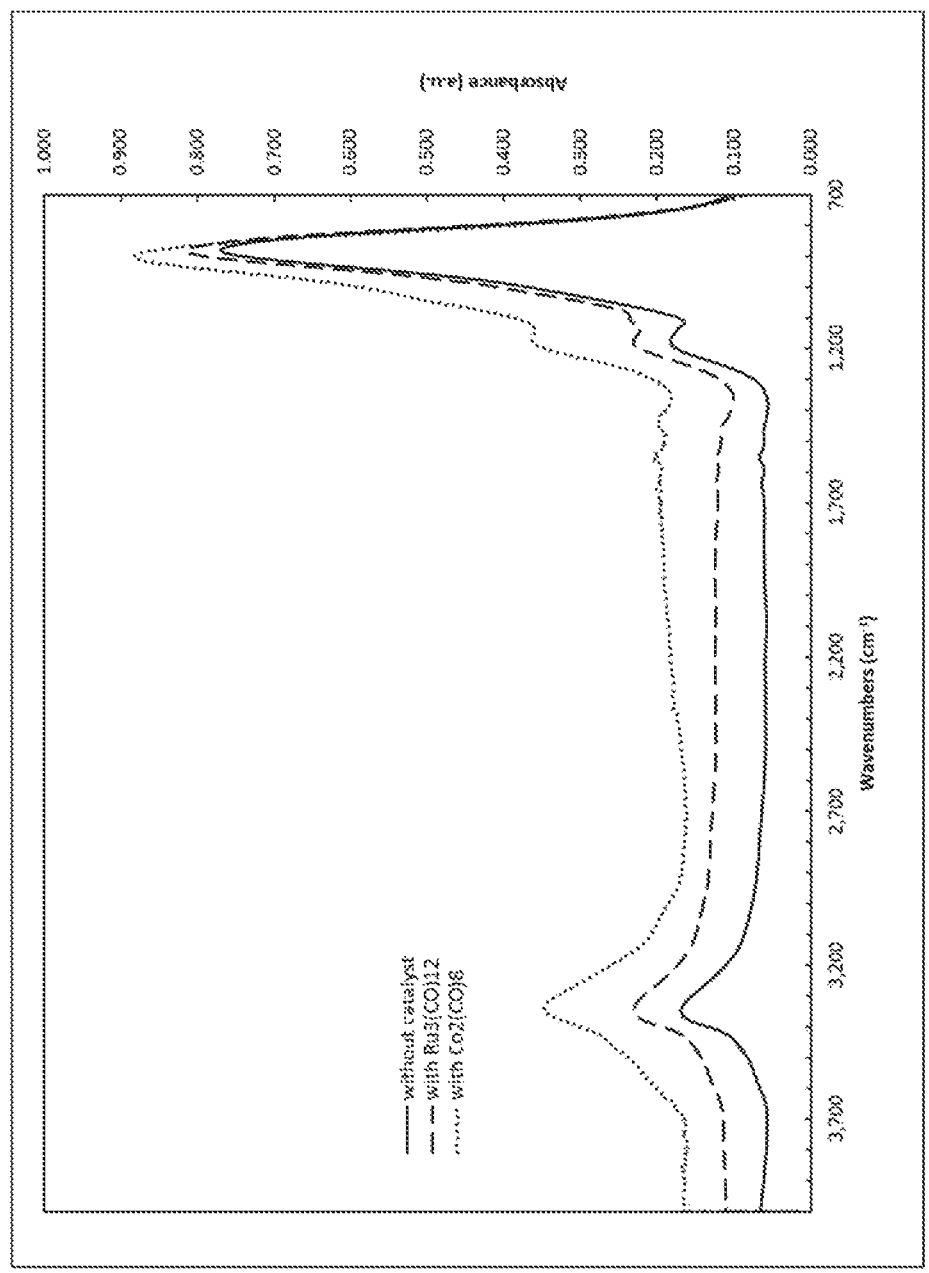
FIG. 13 is a comparative FTIR spectra of the silicon nitride films of Example 9.

The IR spectrum was determined after the curing. The FTIR spectra are shown in FIG. 13. Absorption due to Si—N at a wavelength (cm$^1$) of 890 and absorption due to N—H at 3350 were confirmed. The Si—N signal increases at the same time the Si—H signal decreases. This confirms that the DHC reaction between the N—H from the NH$_3$ and the Si—H from the PHPS adds N to the film. As can be seen, the film formed using Co$_2$(CO)s has the highest N—H signal. In contrast, the PHPS and Ru$_3$(CO)$_{12}$ PHPS formulations have smaller N—H signals. This demonstrates that films having the highest shrinkage have the lowest N—H signals because less N is incorporated into the resulting film.

The film thickness and refractive index (RI) were measured by an ellipsometer. Table 8 below provides the results with and without catalyst, and for two different dehydrocoupling catalysts.

TABLE 8

| Film | Catalyst | Catalyst content | ratio NH$_3$:N$_2$ | Shrinkage | RI |
|---|---|---|---|---|---|
| 1 | — | 0 wt % | 1:0 | 46% | 1.75 |
| 4 | CO$_2$(CO)$_8$ | 1 wt % | 1:0 | 20% | 1.72 |
| 7 | Ru$_3$(CO)$_{12}$ | 1 wt % | 1:0 | 48% | 1.78 |

While not bound by theory, Applicants believe that for SiN films, dehydrocoupling (DHC) catalysts are the most suitable catalysts to avoid extensive shrinkage during the annealing step. The dehydrocoupling catalysts favor insertion of N from the curing atmosphere into the film following a DHC reaction: Si—H (film)+H—N=(vapor)+cat→Si—N=+H$_2$.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:
1. A Si-containing film forming composition comprising
   a) a catalyst and/or a polysilane, and
   b) a N—H free, C-free, and Si-rich perhydropolysilazane having a molecular weight ranging from approximately 332 dalton to approximately 100,000 dalton and comprising N—H free repeating units having the formula [—N(SiH$_3$)$_x$(SiH$_2$-)$_y$], wherein x=0, 1, or 2 and y=0, 1, or 2 with x+y=2; and x=0, 1 or 2 and y=1, 2, or 3 with x+y=3.

2. The Si-containing film forming composition of claim 1, wherein the N—H free, C-free, and Si-rich perhydropolysilazane has a Si:N ratio ranging from approximately 1.5:1 to approximately 2.5:1.

3. The Si-containing film forming composition of claim 1, wherein the N—H free, C-free, and Si-rich perhydropolysilazane has no —Si(—)(H)— and a SiH$_2$:SiH$_3$ ratio ranging from approximately 1 to approximately 5.

4. The Si-containing film forming composition of claim 1, wherein the catalyst is selected from the group consisting of a desilylative coupling catalyst, a dehydrocoupling catalyst and both a desilylative coupling catalyst and a dehydrocoupling catalyst.

5. The Si-containing film forming composition of claim 4, wherein the dehydrocoupling catalyst having the formula $ML_4$, with M being a Group IV or Group V element and each L independently being selected from the group consisting of $NR_2$, OR, $R_5Cp$, R—N—C(R")=N—R', beta-diketonate, iminoketonate, diiminate, and combinations thereof, with R, R' and R" independently being H, a $C_1$-$C_4$ hydrocarbon, or a trialkylsilyl group.

6. The Si-containing film forming composition of claim 4, wherein the catalyst is selected from a metal carbonyl or a metal carbonyl containing molecule, the metal being selected from Co, Ni, Ru, Fe, Rh, Os.

7. The Si-containing film forming composition of claim 4, wherein the catalyst is $Co_2(CO)_8$.

8. The Si-containing film forming composition of claim 1, comprising the polysilane.

9. The Si-containing film forming composition of claim 1, wherein the Si-containing film forming composition comprises the catalyst.

10. The Si-containing film forming composition of claim 8, wherein the polysilane has a formula $$Si_xH_{(2x+2)},$$

wherein x ranges from approximately 4 to approximately 50, preferably from approximately 10 to approximately 40, and more preferably from approximately 15 to approximately 30, or a formula $$Si_nH_{2n+1-m}(NR_2)_m,$$

where each R independently H or a $C_1$-$C_4$ hydrocarbon; m is 1 or 2; and n ranges from approximately 3 to approximately 50.

11. A method of forming a Si-containing film on a substrate, the method comprising contacting the Si-containing film forming composition of claim 1 with the substrate via a spin coating, spray coating, dip coating, or slit coating technique to form the Si-containing film.

12. The method of claim 11, wherein the substrate comprises trenches having an aspect ratio ranging from approximately 1:1 to approximately 1:100.

13. The method of claim 11, further comprising exposing the Si-containing film at a temperature ranging from approximately 30° C. to 200° C.

14. The method of claim 13, further comprising exposing the Si-containing film to an oxidizing atmosphere comprising at least one of $O_2$, $O_3$, $H_2O_2$, $H_2O$, $N_2O$, or NO at a temperature ranging from 200° C. to 1000° C.

15. A Si-containing film forming composition comprising
a) a catalyst and/or a polysilane, and
b) a N—H free, C-free, and Si-rich perhydropolysilazane having a molecular weight ranging from approximately 500 dalton to approximately 1,000,000 dalton and comprising N—H free repeating units having the formula [—N(SiH$_3$)$_x$(SiH$_2$-)$_y$], wherein x=0, 1, or 2 and y=0, 1, or 2 with x+y=2; and x=0, 1 or 2 and y=1, 2, or 3 with x+y=3.

16. The Si-containing film forming composition of claim 15, wherein the molecular weight ranges from approximately 1,000 daltons to approximately 200,000 daltons.

17. The Si-containing film forming composition of claim 15, wherein the molecular weight ranges from approximately 3,000 daltons to approximately 100,000 daltons.

* * * * *